United States Patent
Chang et al.

(10) Patent No.: US 11,456,391 B2
(45) Date of Patent: *Sep. 27, 2022

(54) SOLAR CELL

(71) Applicant: LG ELECTRONICS INC., Seoul (KR)

(72) Inventors: Jaewon Chang, Seoul (KR); Kyungjin Shim, Seoul (KR); Hyunjung Park, Seoul (KR); Junghoon Choi, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/456,575

(22) Filed: Jun. 28, 2019

(65) Prior Publication Data

US 2019/0326451 A1 Oct. 24, 2019

Related U.S. Application Data

(63) Continuation of application No. 14/243,724, filed on Apr. 2, 2014.

(30) Foreign Application Priority Data

Apr. 3, 2013 (KR) .................. 10-2013-0036455
Sep. 9, 2013 (KR) .................. 10-2013-0108046

(51) Int. Cl.
*H01L 31/0747* (2012.01)
*H01L 31/0216* (2014.01)
(Continued)

(52) U.S. Cl.
CPC .... *H01L 31/02167* (2013.01); *H01L 31/0747* (2013.01); *H01L 31/186* (2013.01);
(Continued)

(58) Field of Classification Search
CPC .......... H01L 31/02167; H01L 31/0747; H01L 31/0216; H01L 31/186; H01L 31/1868;
(Continued)

(56) References Cited

U.S. PATENT DOCUMENTS 4,737,197 A  4/1988 Nagahara et al.
5,057,439 A  10/1991 Swanson et al.
(Continued)

FOREIGN PATENT DOCUMENTS

CN  101587913 A  11/2009
CN  102263152 A  11/2011
(Continued)

OTHER PUBLICATIONS

U.S. Appl. No. 14/243,724, filed Apr. 2, 2014.
(Continued)

*Primary Examiner* — Uyen M Tran
(74) *Attorney, Agent, or Firm* — Birch, Stewart, Kolasch & Birch, LLP

(57) ABSTRACT

A solar cell includes a silicon substrate, an emitter area formed on a front surface of the silicon substrate, a tunneling oxide layer formed on a back surface of the silicon substrate, a back surface field area formed on the tunneling oxide layer and formed of a polycrystalline silicon layer, a back passivation film formed on the back surface field area and having an opening, and a back electrode connected to the back surface field area via the opening.

19 Claims, 11 Drawing Sheets

(51) Int. Cl.
  *H01L 31/18* (2006.01)
  *C23C 16/24* (2006.01)
  *H01L 21/48* (2006.01)

(52) U.S. Cl.
  CPC ...... *H01L 31/1864* (2013.01); *H01L 31/1868* (2013.01); *C23C 16/24* (2013.01); *H01L 21/4867* (2013.01); *Y02E 10/50* (2013.01)

(58) Field of Classification Search
  CPC . H01L 31/1864; H01L 21/4867; Y02E 10/50; C23C 16/24
  See application file for complete search history.

(56) References Cited

U.S. PATENT DOCUMENTS

| | | |
|---|---|---|
| 5,332,689 A | 7/1994 | Sandhu et al. |
| 5,529,937 A | 6/1996 | Zhang et al. |
| 5,541,137 A | 7/1996 | Manning et al. |
| 5,981,303 A | 11/1999 | Gilton |
| 7,468,485 B1 | 12/2008 | Swanson |
| 7,633,006 B1 | 12/2009 | Swanson |
| 7,781,669 B2 | 8/2010 | Terakawa et al. |
| 2006/0214251 A1 | 9/2006 | Ratnam et al. |
| 2006/0255340 A1* | 11/2006 | Manivannan ........ H01L 31/068 257/79 |
| 2007/0023081 A1 | 2/2007 | Johnson et al. |
| 2007/0256728 A1 | 11/2007 | Cousins |
| 2008/0251117 A1 | 10/2008 | Schubert et al. |
| 2009/0205712 A1 | 8/2009 | Cousins |
| 2009/0215218 A1 | 8/2009 | Meier et al. |
| 2009/0308438 A1 | 12/2009 | De Ceuster et al. |
| 2010/0084012 A1 | 4/2010 | Ribeyron |
| 2010/0139764 A1 | 6/2010 | Smith |
| 2010/0186802 A1 | 7/2010 | Borden |
| 2010/0186803 A1 | 7/2010 | Borden et al. |
| 2010/0186807 A1 | 7/2010 | Borden |
| 2010/0230771 A1 | 9/2010 | Fork et al. |
| 2011/0056544 A1 | 3/2011 | Ji et al. |
| 2011/0061732 A1* | 3/2011 | Yang ................ H01L 31/02167 136/258 |
| 2011/0126898 A1 | 6/2011 | Harley et al. |
| 2011/0162706 A1 | 7/2011 | Borden et al. |
| 2011/0174374 A1 | 7/2011 | Harder |
| 2011/0272012 A1 | 11/2011 | Heng et al. |
| 2011/0284064 A1 | 11/2011 | Engelhart et al. |
| 2012/0000528 A1 | 1/2012 | Dennis et al. |
| 2012/0055538 A1 | 3/2012 | Lee et al. |
| 2012/0055546 A1 | 3/2012 | Turner |
| 2012/0060908 A1 | 3/2012 | Crafts |
| 2012/0070992 A1* | 3/2012 | Dong ..................... G03F 7/425 438/694 |
| 2012/0167982 A1 | 7/2012 | Fujishima et al. |
| 2012/0180860 A1 | 9/2012 | Ko et al. |
| 2012/0222731 A1 | 9/2012 | Hsieh et al. |
| 2012/0305060 A1 | 12/2012 | Fu et al. |
| 2012/0318340 A1 | 12/2012 | Heng et al. |
| 2013/0025658 A1 | 1/2013 | Bedell et al. |
| 2013/0078758 A1 | 3/2013 | Dennis et al. |
| 2013/0017801 A1 | 7/2013 | Ginley et al. |
| 2013/0247965 A1 | 9/2013 | Swanson et al. |
| 2013/0284259 A1* | 10/2013 | Jin .................... H01L 31/02167 136/256 |
| 2013/0298973 A1 | 11/2013 | Xie et al. |
| 2014/0159042 A1 | 6/2014 | Hutchings et al. |
| 2015/0059839 A1 | 3/2015 | Yano |
| 2015/0280031 A1 | 10/2015 | Smith |
| 2016/0072000 A1 | 3/2016 | Smith |
| 2016/0233348 A1 | 8/2016 | Smith |
| 2018/0277701 A1 | 9/2018 | Lenes et al. |

FOREIGN PATENT DOCUMENTS

| | | | |
|---|---|---|---|
| CN | 102983209 A | 3/2013 | |
| DE | 10 2008 045 522 A1 | 3/2010 | |
| EP | 0 639 856 A1 | 2/1995 | |
| EP | 2 387 079 A2 | 11/2011 | |
| EP | 2822042 A1 | 1/2015 | |
| JP | 2003-282458 A | 10/2003 | |
| JP | 2005-101239 A | 4/2005 | |
| JP | 2009-295715 A | 12/2009 | |
| JP | 2010-87520 A | 4/2010 | |
| JP | 2012-60080 A | 3/2012 | |
| JP | WO2013/128628 A1 | 9/2013 | |
| JP | 5782112 B2 | 9/2015 | |
| JP | WO2017/163498 A1 | 9/2017 | |
| KR | 10-2009-0009224 A | 1/2009 | |
| KR | 10-2012-0064495 A | 6/2012 | |
| KR | 10-2012-0084104 A | 7/2012 | |
| KR | 10-2013-0048948 A | 5/2013 | |
| KR | 10-1442011 B1 | 9/2014 | |
| WO | WO 2006/111138 A1 | 10/2006 | |
| WO | WO 2009/131587 A1 | 10/2009 | |
| WO | WO 2010/000716 A2 | 1/2010 | |
| WO | WO 2012/036146 A1 | 3/2012 | |
| WO | WO-2012093845 A2 * | 7/2012 | ....... H01L 31/02167 |
| WO | WO 2015/044070 A1 | 4/2015 | |
| WO | WO 2015/044122 A1 | 4/2015 | |
| WO | WO 2016/049245 A1 | 3/2016 | |
| WO | WO 2018/026277 A1 | 2/2018 | |

OTHER PUBLICATIONS

Gan et al., "Polysilicon Emitters For Silicon Concentrator Solar Cells", IEEE, 1990, pp. 245-250.

Tarr, "A Polysilicon Emitter Solar Cell", IEEE Electron Device Letters, vol. EDL-6, No. 12, Dec. 1985, pp. 655-658.

* cited by examiner

SOLAR CELL

CROSS-REFERENCE TO RELATED APPLICATION

This application is a Continuation of U.S. application Ser. No. 14/243,724, filed Apr. 2, 2014, which claims the priority benefit of Korean Patent Application Nos. 10-2013-0036455 filed on Apr. 3, 2013 and 10-2013-0108046 filed on Sep. 9, 2013 in the Korean Intellectual Property Office, the disclosures of all these applications are incorporated herein by reference.

BACKGROUND OF THE INVENTION

1. Field of the Invention

The embodiments of the invention relate to a solar cell and, more particularly, to a solar cell including a semiconductor substrate.

2. Description of the Related Art

In recent years, as conventional energy resources such as petroleum and coal are expected to be depleted, interest in alternative energy resources replacing these energy resources is on the rise. Of these, solar cells are attracting considerable attention as next generation cells which convert solar energy into electrical energy.

Such a solar cell may be manufactured by forming conductive type areas and electrodes electrically connected thereto on a semiconductor substrate in order to cause photoelectric conversion. In addition, the solar cell may include a passivation film for passivating a conductive type area, an anti-reflective film for preventing reflection and the like in order to improve properties of the solar cells.

In this regard, efficiency of conventional solar cells may be deteriorated due to recombination of carriers on the semiconductor substrate, long transfer distances of the carriers and the like. Accordingly, solar cells should be designed so that efficiency thereof can be maximized.

SUMMARY OF THE INVENTION

It is an object of the embodiment of the invention to provide a solar cell which is capable of maximizing efficiency.

In accordance with one aspect of the embodiment of the invention, the above and other objects can be accomplished by the provision of a solar cell including a semiconductor substrate, a first tunneling layer entirely formed over a surface of the semiconductor substrate, a first conductive type area disposed on the surface of the semiconductor substrate, and an electrode including a first electrode connected to the first conductive type area, wherein the first conductive type area includes a first portion which is disposed on the first tunneling layer and includes a polycrystalline, amorphous or microcrystalline semiconductor doped with a first conductive type dopant.

According to an embodiment of the invention, after the tunneling layer is formed on the semiconductor substrate, conductive type areas (emitter area, back surface field area and the like) are formed on the tunneling layer. As a result, defects on the back surface of the semiconductor substrate are effectively removed and carriers causing photoelectric conversion are efficiently transferred. Accordingly, damage to the semiconductor substrate is prevented and recombination sites on the back surface of the semiconductor substrate are thus efficiently removed. Accordingly, efficiency of the solar cells can be further improved.

In a solar cell according to another embodiment of the invention, conductive type areas include a plurality portions disposed such that the tunneling layer is interposed between the portions, thereby minimizing recombination on the semiconductor substrate and improving electrical connection to electrodes. As a result, efficiency of the solar cells can be improved.

BRIEF DESCRIPTION OF THE DRAWINGS

The above and other objects, features and other advantages of the embodiments of the invention will be more clearly understood from the following detailed description taken in conjunction with the accompanying drawings, in which.

DETAILED DESCRIPTION OF THE EMBODIMENTS

Figure 1:
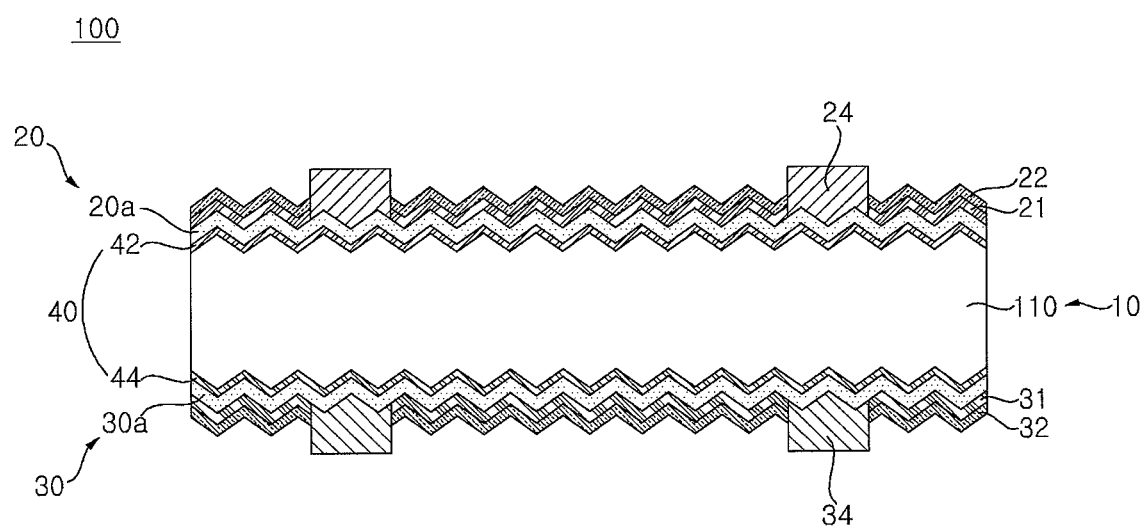
FIG. 1 is a sectional view illustrating a solar cell according to an embodiment of the invention.

Reference will now be made in detail to the example embodiments of the invention, examples of which are illustrated in the accompanying drawings. The embodiments of the invention are not limited to the embodiments and the embodiments may be modified into various forms.

In the drawings, parts unrelated to description are not illustrated for clear and brief description of the embodiments of the invention, and the same reference numbers will be used throughout the specification to refer to the same or similar parts.

In the drawings, the thickness or size is exaggerated or reduced for more clear description. In addition, the size or area of each constituent element is not limited to that illustrated in the drawings.

It will be further understood that, throughout this specification, when one element is referred to as "comprising" another element, the term "comprising" specifies the presence of another element but does not preclude the presence of other additional elements, unless context clearly indicates otherwise. In addition, it will be understood that when one element such as a layer, a film, a region or a plate is referred to as being "on" another element, the one element may be directly on the another element, and one or more intervening elements may also be present. In contrast, when one element such as a layer, a film, a region or a plate is referred to as being "directly on" another element, one or more intervening elements are not present.

Hereinafter, a solar cell according to an embodiment of the invention will be described in more detail with reference to the annexed drawings.

Figure 2:
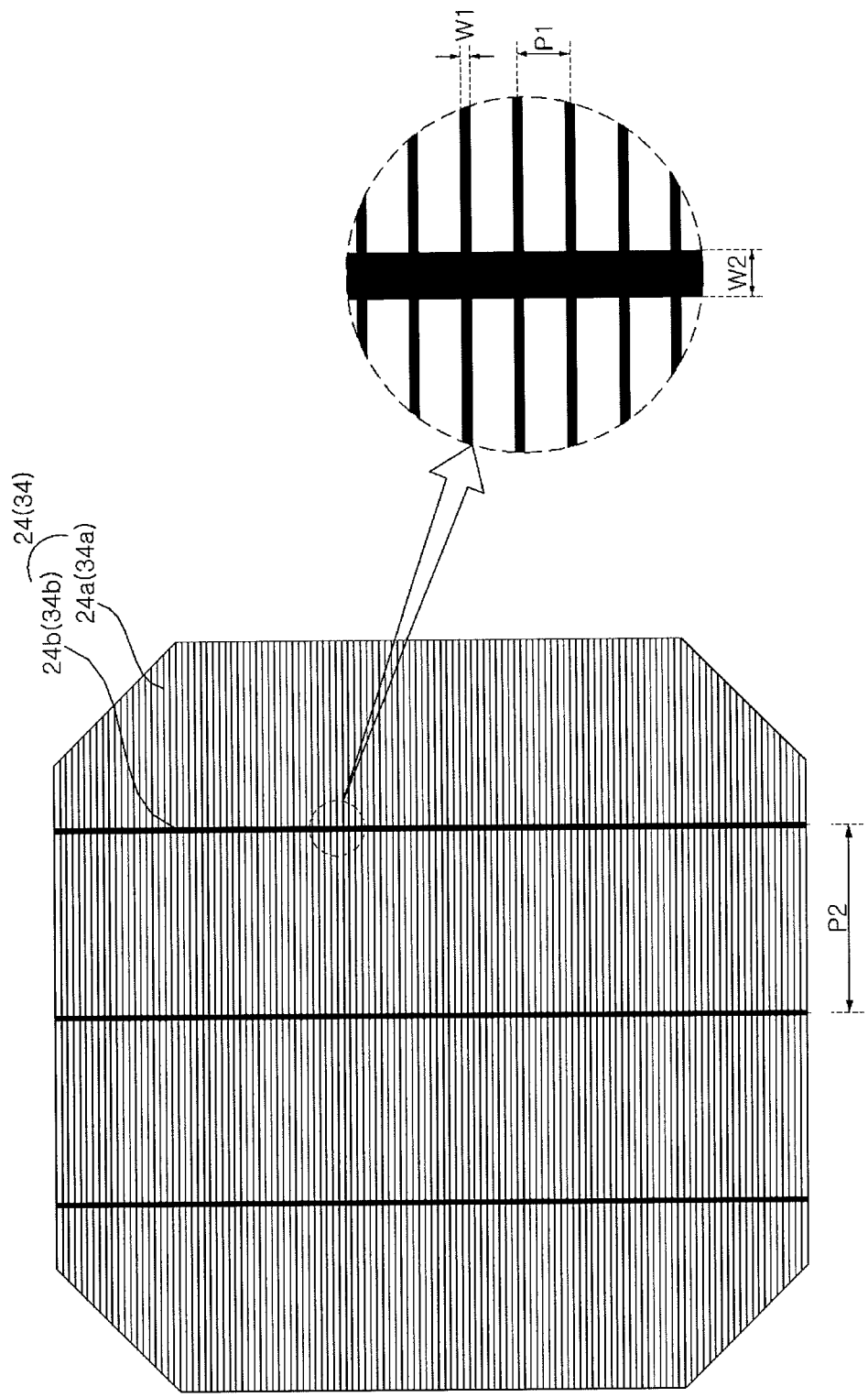
FIG. 2 is a plan view illustrating the solar cell according to the embodiment.

FIG. 1 is a sectional view illustrating a solar cell according to an embodiment of the invention. FIG. 2 is a plan view illustrating the solar cell according to the embodiment.

Referring to FIGS. 1 and 2, the solar cell 100 according to the embodiment of the invention includes a substrate (for example, semiconductor substrate, hereinafter, referred to as a "semiconductor substrate") 10, conductive type areas 20 and 30, electrodes 24 and 34 connected to the conductive type areas 20 and 30, and at least one tunneling layer 40. The conductive type areas 20 and 30 may include an emitter area 20 and a back surface field area 30 and the electrodes 24 and 34 may include first and second electrodes 24 and 34 respectively connected to the emitter area 20 and the back surface field area 30. The tunneling layer 40 may be interposed between the semiconductor substrate 10 and at least one of the conductive type areas 20 and 30. The tunneling layer 40 may be included with a first passivation film 21, a first anti-reflective film 22, a second passivation film 31, a second anti-reflective film 32 and the like. This configuration will be described in more detail.

One of the emitter area 20 and the back surface field area 30 is referred to as a "first conductive type area" and the other is referred to as a "second conductive type area". In the embodiment of the invention, terms such as first or second are used for only distinguishing the elements and the embodiments of the invention are not limited thereto.

The semiconductor substrate 10 may include a base area 110 containing a relatively low doping concentration of a first conductive type dopant. The base area 110 may be composed of a crystalline semiconductor including the first conductive type dopant. For example, the base area 110 may include a monocrystalline or polycrystalline semiconductor (for example, monocrystalline or polycrystalline silicon) including a first conductive type dopant. In particular, the base area 110 may be composed of a monocrystalline semiconductor (for example, a monocrystalline semiconductor wafer, more specifically, a semiconductor silicon wafer) including a first conductive type dopant. As such, when the base area 110 is composed of monocrystalline silicon, the solar cell 100 constitutes a monocrystalline silicon solar cell. As such, the solar cell 100 including a monocrystalline semiconductor is based on the base area 110 or the semiconductor substrate 10 which has little defects due to superior crystallinity, thus exhibiting superior electrical properties.

The first conductive type dopant is for example an n-type or a p-type dopant. That is, the first conductive type dopant may be an n-type impurity such as a Group V element including phosphorous (P), arsenic (As), bismuth (Bi), antimony (Sb) or the like. Alternatively, the first conductive-type dopant may be a p-type impurity such as a Group III element including boron (B), aluminum (Al), gallium (Ga), indium (In) or the like.

In this instance, the base area 110 may include an n-type impurity as a first conductive type dopant. As a result, the emitter area 20 forming a pn junction with the base area 110 is p-type. When light is emitted to the pn junction, electrons created by photoelectric effect are moved to a second surface (hereinafter, referred to a "back surface") of the semiconductor substrate 10 and are collected by the second electrode 34, and holes are moved toward a front surface of the semiconductor substrate 10 and are then collected by the first electrode 24. As a result, electric energy is generated. Holes having a low movement speed are moved to the front surface of the semiconductor substrate 10, rather than the back surface thereof, thereby improving photoelectric conversion efficiency, but the embodiment of the invention is not limited thereto, and the base area 110 and the back surface field area 30 may be p-type and the emitter area 20 may be n-type in other embodiment of the invention.

In the embodiment of the invention, the semiconductor substrate 10 may include only the base area 110. That is, in conventional solar cells, a doping area having a conductive type different from the semiconductor substrate 10, or a doping area having the same conductive type as the semiconductor substrate 10 and a relatively high doping concentration or the like is formed on the semiconductor substrate 10. On the other hand, in the embodiment of the invention, the semiconductor substrate 10 includes only the base area 110 and does not include an additional doping area.

As described above, the semiconductor substrate 10 is composed of only the base area and does not include an additional doping area. For example, a difference between the lowest doping concentration and the highest doping concentration in the semiconductor substrate 10 may be 10% or less. The difference of 10% or less is given as an example for determining a level in which doping for forming an additional dopant area is not performed and the embodiment of the invention is not limited thereto. That is, the difference of 10% or less is a range of doping variation that may occur within the substrate, and is akin to a margin of error. Accordingly, the embodiment of the invention includes all instances in which a semiconductor substrate 10 is generally not provided with an additional doping area.

In the embodiment of the invention, the semiconductor substrate 10 is not provided with an additional doping area, thus improving an open circuit voltage. The reason for this is that it is possible to prevent surface recombination of carriers which may be generated or occur due to formation of the doping area on the semiconductor substrate 10.

In the embodiment of the invention, the front and back surfaces of the semiconductor substrate 10 are textured so that the surfaces have irregularities such as pyramidal shape. When surface roughness is increased due to irregularities formed on the front surface of the semiconductor substrate 10 by texturing, reflection of light incident upon the front surface of the semiconductor substrate 10 can be decreased. Accordingly, an amount of light reaching the tunnel junction formed by the semiconductor substrate 10 and the emitter area 20 is increased and light loss is thus minimized, but the embodiment of the invention is not limited thereto and only one of the front and back surfaces of the semiconductor substrate 10 may be textured or both of them may be not textured.

A first tunneling layer 42 is entirely formed over one surface (for example, front surface, hereinafter, referred to as a "front surface") of the semiconductor substrate 10. As used herein, the expression "entirely formed" means that an element such as a layer is formed over an entire surface without an empty area or a non-coverage area, or is formed over an entire area excluding pre-designated or inevitably formed regions such as periphery region, isolation region or the like.

The first tunneling layer 42 passivates the surface of the semiconductor substrate 10 having many recombination sites and facilities transfer of carriers through a tunneling effect.

The first tunneling layer 42 may include a material providing passivation and tunneling effects, for example, oxide, nitride, a semiconductor, a conductive polymer or the like. For example, the first tunneling layer 42 may include silicon oxide, silicon nitride, silicon oxide nitride, intrinsic amorphous silicon, intrinsic polycrystalline silicon or the like. In this instance, the first tunneling layer 42 can be easily and stably formed.

In order to provide sufficient passivation and tunneling effects, the first tunneling layer 42 may have a thickness of 5 nm or less, or 0.5 nm to 5 nm (for example, 0.5 nm to 4 nm, for example, 0.5 nm to 2 nm). When the thickness of the first tunneling layer 42 exceeds 5 nm, tunneling is not efficiently performed and the solar cell 100 may not operate, and when the thickness of the first tunneling layer 42 is less than 0.5 nm, passivation property may be deteriorated. In order to further improve the tunneling effect, the thickness of the first tunneling layer 42 may be 0.5 nm to 4 nm, more specifically, 0.5 nm to 2 nm, but the embodiment of the invention is not limited thereto and the thickness of the first tunneling layer 42 may be changed.

In the embodiment of the invention, the first tunneling layer 42 is formed over the front surface of the semiconductor substrate 10, thereby entirely removing defects on the front surface of the semiconductor substrate 10. As a result, open circuit voltage of the solar cell 100 is improved and efficiency of the solar cell 100 is thus enhanced.

In the embodiment of the invention, the emitter area 20 includes a first portion 20a formed on the first tunneling layer 42. The first portion 20a may include a polycrystalline, amorphous or microcrystalline semiconductor having a different conductive type (for example, p-type or n-type) from the semiconductor substrate 10. For example, the emitter area may include polycrystalline silicon, amorphous silicon or microcrystalline silicon doped with a second conductive type dopant. In this instance, the emitter area 20 including the first portion 20a can be easily manufactured by various methods by forming the first portion 20a with a polycrystalline, amorphous or microcrystalline semiconductor.

In the embodiment of the invention, the first portion 20a of the emitter area 20 may be entirely formed over the first tunneling layer 42. As used herein, the expression "entirely formed" means that an element such as a layer is formed over an entire surface without an empty area or a non-coverage area, or is formed over an entire area excluding pre-designated or inevitably formed regions such as periphery region, isolation region or the like. A first passivation film 21 and/or a first anti-reflective film 22 may be formed on the emitter area 20 (more specifically, a first portion 20a). In the embodiment of the invention, a configuration in which the first passivation film 21 is formed on the emitter area 20 and the first anti-reflective film 22 is formed on the first passivation film 21 is exemplified. In the embodiment, the first passivation film 21 may be formed in a substantially entire region over the front surface of the back surface field area 30, excluding a region corresponding to the first electrode 24. In addition, the first anti-reflective film 22 may be formed in a substantially entire region over the front surface of the first passivation film 21, excluding a region corresponding to the first electrode 24.

The first passivation film 21 passivates defects present in the emitter area 20, removes recombination sites of minority carriers and thereby increases an open circuit voltage of the solar cell 100. In addition, the first anti-reflective film 22 reduces reflectivity of light incident upon the front surface of the semiconductor substrate 10, thereby increasing the amount of light reaching the tunnel junction formed through the semiconductor substrate 10 and the emitter area 20. Accordingly, short circuit current (Isc) of the solar cell 100 can be increased. As such, the first passivation film and the first anti-reflective film 22 increase open circuit voltage and short circuit current of the solar cell 100, thereby improving efficiency of the solar cell 100.

The first passivation film 21 may be formed of a material capable of effectively passivating the emitter area 20. For example, the first passivation film 21 may be a single film including one selected from the group consisting of silicon nitride, silicon nitride containing hydrogen, silicon oxide, silicon oxide nitride, aluminum oxide, zirconium oxide, hafnium oxide, $MgF_2$, ZnS, $TiO_2$ and $CeO_2$, or a multilayer film including a combination of two or more films. When the emitter area 20 is n-type, the first passivation film 21 may include silicon oxide or silicon nitride having a positive charge or the like, and when the emitter area 20 is p-type, the first passivation film 21 may include aluminum oxide, zirconium oxide, hafnium oxide or the like having a negative charge.

In addition, the first anti-reflective film 22 may be formed of a variety of materials capable of preventing surface reflection. For example, the first anti-reflective film 22 may be a single film including one selected from the group consisting of silicon nitride, silicon nitride containing hydrogen, silicon oxide, silicon oxide nitride, aluminum oxide, $MgF_2$, ZnS, $TiO_2$ and $CeO_2$, or a multilayer film including a combination of two or more films. However, the embodiment of the invention is not limited thereto and the first anti-reflective film 22 may include a variety of materials.

The first electrode 24 is electrically connected to the emitter area 20 via an opening formed in the first passivation film 21 and the first anti-reflective film 22 (that is, while passing through the first passivation film 21 and first anti-reflective film 22). The first electrode may be formed to have various shapes using various materials. Plane shape of the first electrode 24 or the like will be described in more detail later.

Meanwhile, a second tunneling layer 44 is entirely formed over another surface (for example, back surface, hereinafter, referred to as a "back surface") of the semiconductor substrate 10. As used herein, the expression "entirely formed" means that an element such as a layer is formed over an entire surface without an empty area or a non-coverage area, or is formed in an entire area excluding pre-designated or inevitably formed regions such as periphery region, isolation region or the like.

The second tunneling layer 44 passivates the surface of the semiconductor substrate 10 having many recombination sites and facilities transfer of carriers through a tunneling effect.

The second tunneling layer 44 may include a material providing passivation and tunneling effects, for example, oxide, nitride, a semiconductor, a conductive polymer or the like. For example, the second tunneling layer 44 may include silicon oxide, silicon nitride, silicon oxide nitride, intrinsic amorphous silicon, intrinsic polycrystalline silicon or the like. In this instance, the second tunneling layer 44 can be easily and stably formed.

In order to provide sufficient passivation and tunneling effects, the second tunneling layer 44 may have a thickness of 5 nm or less, or 0.5 nm to 5 nm (for example, 0.5 nm to 4 nm, for example, 0.5 nm to 2 nm). When the thickness of the second tunneling layer 44 exceeds 5 nm, tunneling is not efficiently performed and the solar cell 100 may not operate, and when the thickness of the second tunneling layer 44 is less than 0.5 nm, passivation property may be deteriorated. In order to further improve the tunneling effect, the thickness of the second tunneling layer 44 may be 0.5 nm to 4 nm, more specifically, 0.5 nm to 2 nm, but the embodiment of the invention is not limited thereto and the thickness of the second tunneling layer 44 may be changed.

The second tunneling layer 44 is formed over the back surface of the semiconductor substrate 10, thereby entirely removing defects on the back surface of the semiconductor substrate 10. As a result, open circuit voltage of the solar cell 100 is improved and efficiency of the solar cell 100 is thus enhanced.

In the embodiment of the invention, the back surface field area 30 includes a first portion 30a formed on the second tunneling layer 44. The first portion 30a of the back surface field area 30 formed on the second tunneling layer 44 may include a polycrystalline, amorphous or microcrystalline semiconductor having the same conductive type (for example, p-type or n-type) as the semiconductor substrate 10. For example, the first portion 30a of the back surface field area 30 may include a polycrystalline silicon, amorphous silicon or microcrystalline silicon doped with a first conductive type dopant. In this instance, the back surface field area 30 can be easily manufactured by various methods by forming the first portion 30a of the back surface field area 30 with a polycrystalline, amorphous or microcrystalline semiconductor.

In the embodiment of the invention, the back surface field area 30 may be entirely formed over the second tunneling layer 44. As used herein, the expression "entirely formed" means that an element such as a layer is formed over an entire surface without an empty area or a non-coverage area, or is formed in an entire area excluding pre-designated or inevitably formed regions such as periphery region, isolation region or the like.

A second passivation film 31 and/or a second anti-reflective film 32 may be formed on the back surface field area 30. In the embodiment of the invention, a configuration in which the second passivation film 31 is formed on the back surface field area 30 and the second anti-reflective film 32 is formed on the second passivation film 31 is exemplified. In the embodiment of the invention, the second passivation film 31 may be formed in a substantially entire region over the front surface of the back surface field area 30, excluding a region corresponding to the second electrode 34. In addition, the second anti-reflective film 32 may be formed in a substantially entire region over the front surface of the second passivation film 31, excluding a region corresponding to the second electrode 34.

The second passivation film 31 passivates defects present in the back surface field area 30, removes recombination sites of minority carriers and thereby increases an open circuit voltage of the solar cell 100. In addition, the second anti-reflective film 32 reduces reflectivity of light incident upon the back surface of the semiconductor substrate 10, thereby increasing the amount of light reaching the tunnel junction formed through the semiconductor substrate 10 and the emitter area 20. Accordingly, short circuit current (Isc) of the solar cell 100 can be increased. As such, the second passivation film 31 and the second anti-reflective film 32 increase open circuit voltage and short circuit current of the solar cell 100, thereby improving efficiency of the solar cell 100.

The second passivation film 31 may be formed of a material capable of effectively passivating the back surface field area 30. For, example, the second passivation film 31 may be a single film including one selected from the group consisting of silicon nitride, silicon nitride film containing hydrogen, silicon oxide, silicon oxide nitride, aluminum oxide, zirconium oxide, hafnium oxide, $MgF_2$, ZnS, $TiO_2$ and $CeO_2$, or a multilayer film including a combination of two or more films. When the back surface field area 30 is p-type, the second passivation film 31 may include aluminum oxide, zirconium oxide, hafnium oxide or the like having a negative charge, and when the back surface field area 30 is n-type, the second passivation film 31 may include silicon oxide, silicon nitride or the like having a positive charge.

In addition, the second anti-reflective film 32 may be formed of a variety of materials capable of preventing surface reflection. For example, the second anti-reflective film 32 may be a single film including one selected from the group consisting of silicon nitride, silicon nitride containing hydrogen, silicon oxide, silicon oxide nitride, aluminum oxide, $MgF_2$, ZnS, $TiO_2$ and $CeO_2$, or a multilayer film including a combination of two or more films. However, the embodiment of the invention is not limited thereto and the second anti-reflective film 32 may include a variety of materials.

The second electrode 34 is electrically connected to the back surface field area 30 via an opening formed in the second passivation film 31 and the second anti-reflective film 32 (that is, while passing through the second passivation film 31 and the second anti-reflective film 32). The second electrode 34 may be formed to have various shapes using various materials. Plane shape of the second electrode 34 or the like will be described in more detail later.

Hereinafter, plane shapes of the first and second electrodes 24 and 34 will be described in more detail with reference to FIG. 2.

Referring to FIG. 2, the first and second electrodes 24 and 34 may for example include a plurality of finger electrodes 24a and 34a having a first pitch P1 and being disposed in parallel to each other. The first and second electrodes 24 and 34 may include bus bar electrodes 24b and 34b which are formed in a direction crossing a direction in which the finger electrodes 24a and 34a are disposed and connect the finger electrodes 24a and 34a. Such a bus bar electrode 24b or 34b may be only one, and bus bar electrodes having a second pitch P2 larger than the first pitch P1 may be provided. In this instance, a width W2 of the bus bar electrode 24b may be greater than a width W1 of the finger electrode 24a, but the embodiment of the invention is not limited thereto and the width W2 of the bus bar electrode 24b may be equal to or smaller than the width W1 of the finger electrode 24a. In addition, various modifications such as a configuration in which the bus bar electrode 24b is not formed are possible. The shape of the first electrode 24 is provided only as an example, but the embodiment of the invention is not limited thereto. In the drawing, the first pitch P1 of the first and second electrodes 24 and 34 is described without distinction and the second pitch P2 of the first and second electrodes 24 and 34 is described without distinction. The first pitch P1 of the first electrode 24 may be equal to or different from the first pitch P1 of the second electrode 34, and the second pitch P2 of the first electrode 24 may be equal to or different from the second pitch P2 of the second electrode 34.

As seen from the cross-section, the finger electrode 24a and the bus bar electrode 24b of the first electrode 24 may pass through the first passivation film 21 and the first anti-reflective film 22. Similarly, the finger electrode 34a and the bus bar electrode 34b of the second electrode 34 may pass through the second passivation film 31 and the second anti-reflective film 32. Alternatively, the finger electrode 24a of the first electrode 24 may pass through the first passivation film 21 and the first anti-reflective film 22 and the bus bar electrode 24b may be formed on the first passivation film 21. Similarly, the finger electrode 34a of the second electrode 34 may pass through the second passivation film 31 and the second anti-reflective film 32 and the bus bar electrode 34b may be formed on the second passivation film 31 and the anti-reflective film 32.

The first and second electrodes 24 and 34 may be composed of a highly conductive metal or the like and may be formed by a variety of methods such as coating, deposition, printing or the like. The embodiment of the invention is not limited to materials, formation method and the like, of the first and second electrodes 24 and 34.

In the solar cell 100 having the structure, the first portion 20a of the emitter area 20 which is another conductive type area is formed on the front surface of the semiconductor substrate 10 such that the first tunneling layer 42 is interposed between the first portions 20a and the semiconductor substrate 10. The first tunneling layer is entirely formed over the front surface of the semiconductor substrate 10, thereby effectively removing defects on the front surface of the semiconductor substrate 10. In this instance, the first tunneling layer 42 effectively transfers carriers causing photoelectric conversion. That is, in conventional solar cells, a portion of the semiconductor substrate is doped at a high concentration with a dopant, thereby forming a doping area serving as an emitter area in the semiconductor substrate. In such an instance, doping with the dopant causes damage to the semiconductor substrate and generation of recombination sites on the surface of the semiconductor substrate. Although a passivation film is formed in order to prevent these problems, the passivation film is not disposed in portions adjacent to electrodes on the semiconductor substrate, thus making effective removal of the recombination sites difficult. Accordingly, efficiency of the solar cell is low due to recombination sites on the surface of the semiconductor substrate.

On the other hand, in the embodiment of the invention, the front surface of the semiconductor substrate where many recombination sites may be present is entirely passivated using the first tunneling layer 42 and the first portion 20a of the emitter area 20 is formed on the first tunneling layer 42. As a result, damage to the semiconductor substrate 10 is prevented and recombination sites on the front surface of the semiconductor substrate are effectively removed. In particular, the emitter area 20 is composed of only the first portion 20a, thereby simplifying a structure of the emitter area 20 and minimizing damage to the semiconductor substrate 10. As a result, efficiency of the solar cell 100 can be improved.

In addition, the back surface field area 30 which is another conductive type area is formed on the back surface of the semiconductor substrate 10 such that the second tunneling layer 44 is interposed between the back surface field area 30 and the semiconductor substrate 10. The second tunneling layer 44 is entirely formed over the back surface of the semiconductor substrate 10, thereby effectively removing defects on the back surface of the semiconductor substrate 10. In this instance, the second tunneling layer 44 effectively transfers carriers causing photoelectric conversion. As a result, damage to the semiconductor substrate 10 is further prevented and recombination sites on the back surface of the semiconductor substrate 10 are effectively removed. In particular, the back surface field area 30 is composed of only the first portion 30a, thereby simplifying a structure of the back surface field area 30 and minimizing damage to the semiconductor substrate 10. As a result, efficiency of the solar cell 100 can be further improved.

Based on this configuration, the semiconductor substrate 10 includes only the base area 110 without any additional doping area, thus maintaining superior properties of the semiconductor substrate 10.

In this instance, the emitter area 20 and the back surface field area 30 may be disposed at different sides of the semiconductor substrate 10 to form a double-surface light-receiving type structure. As a result, light is incident upon the back surface of the semiconductor substrate 10 as well as the front surface of the semiconductor substrate 10, thereby increasing an amount of incident light and improving efficiency of the solar cell 100. Because the emitter area 20 and the back surface field area 30 are not adjacent to each other, the necessity of performing an isolation process when the emitter area 20 and the back surface field area 30 are formed to be adjacent to each other is eliminated. In addition, because the emitter area 20 and the back surface field area 30 are entirely formed, thus requiring no additional patterning and alignment processes. As a result, manufacturing process is simplified and cost is thus reduced.

In addition, the first passivation film 21 and the first anti-reflective film 22 are formed on the front surface of the semiconductor substrate 10, thereby further improving efficiency of the solar cell 100.

In addition, the second electrode 34 is formed to have a configuration including the finger electrode 34a and the bus bar electrode 34b, thereby enabling light to be incident upon the back surface of the semiconductor substrate 10 and enhancing utilization of light. In this instance, the second passivation film 31 and the second anti-reflective film 32 are formed on the back surface of the semiconductor substrate 10, thereby further improving efficiency of the solar cell 100.

Hereinafter, solar cells according to modified embodiments and other embodiments of the invention will be described in more detail with reference to FIGS. 3 to 10. Details of contents or elements that are the same as or similar to the description given above are not further mentioned, and only description that differ from the description above is described in detail.

Figure 3:
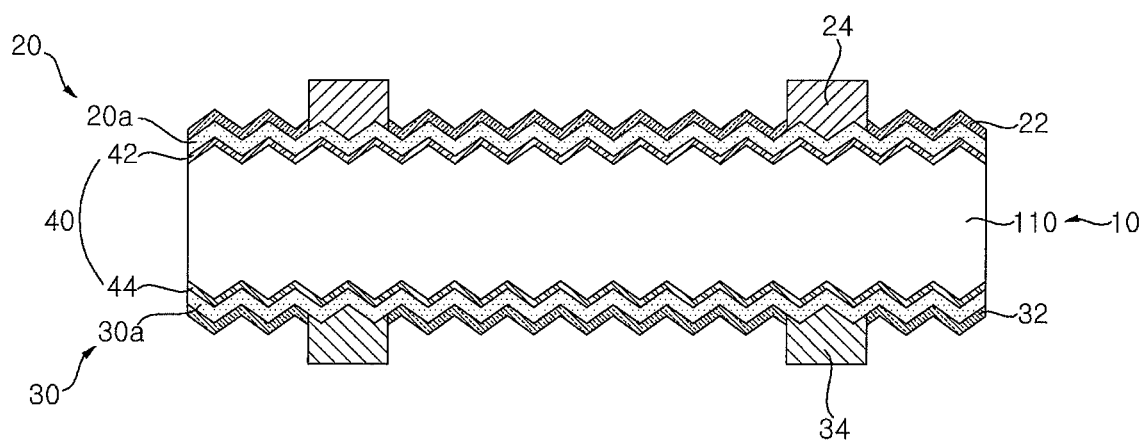
FIG. 3 is a sectional view illustrating a solar cell according to a modified embodiment of the embodiment shown in FIG. 1.

FIG. 3 is a sectional view illustrating a solar cell according to a modified embodiment of the embodiment shown in FIG. 1.

Referring to FIG. 3, the solar cell according to the modified embodiment does not include first and second passivation films 21 and 31, and includes the first anti-reflective film 22 formed on the emitter area 20 and the second anti-reflective film 32 formed on the back surface field area 30. Based on this configuration, the overall process is simplified and manufacturing cost is thus reduced. In addition, the first and second anti-reflective films 22 and 32 also serve as passivation films. As a result, production efficiency is improved and superior properties of the solar cell are maintained.

The embodiment of the invention allows other various modifications. For example, all configurations in which at least one of the first and second passivation films 21 and 22 and the first and second anti-reflective films 31 and 32 is not provided fall into the scope of the embodiment of the invention.

Figure 4:
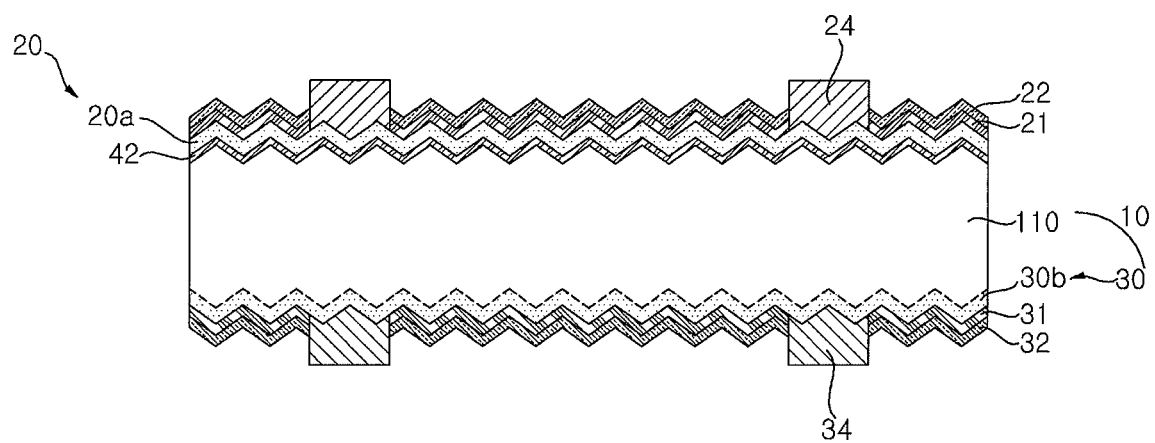
FIG. 4 is a sectional view illustrating a solar cell according to another embodiment of the invention.

FIG. 4 is a sectional view illustrating a solar cell according to another embodiment of the invention.

Referring to FIG. 4, the solar cell according to the embodiment of the invention has a configuration in which the back surface field area 30 includes a second portion 30*b* including a doping area formed in the semiconductor substrate 10. That is, the semiconductor substrate 10 may include the base area 110 as an undoped area and the second portion 30*b* of the back surface field area 30 formed by doping the semiconductor substrate 10 with a dopant having the same conductive type as the semiconductor substrate 10. As a result, the second portion 30*b* may have the same crystalline structure as the base area 110. The second portion 30*b* of the back surface field area 30 may be formed by a variety of doping methods (for example, thermal diffusion, ion implantation or the like).

In the drawing, an instance in which the second portion 30*b* of the back surface field area 30 has a homogeneous structure having a uniform doping concentration is exemplified, but the embodiment of the invention is not limited thereto and modified embodiments associated therewith will be described again with reference to FIGS. 5 and 6.

The second passivation film 31 and/or the second anti-reflective film 32 may be formed on the back surface field area 30.

In an instance in which the back surface field area 30 including the second portion 30*b* formed by doping the semiconductor substrate 10 is formed, a previous process may be used on the back surface during formation of the back surface field area 30. That is, the first portion 20*a* of the emitter area 20 is formed on the first tunneling layer 42 on the front surface of the semiconductor substrate 10, thereby improving efficiency of the solar cell and previous equipment may be used in the second portion 30*b* of the back surface field area 30. That is, properties can be improved in consideration of efficiency and production efficiency.

Figure 5:
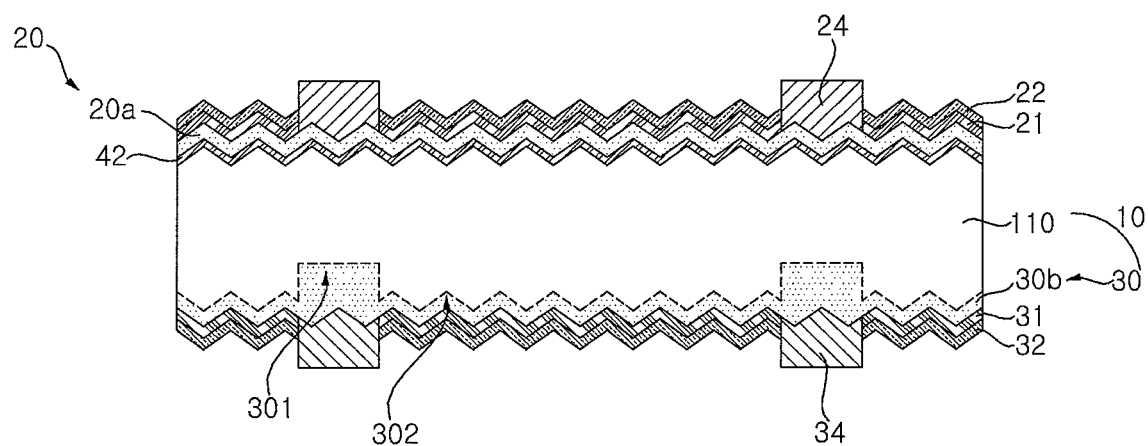
FIG. 5 is a sectional view illustrating a solar cell according to a modified embodiment of the embodiment shown in FIG. 4.

FIG. 5 is a sectional view illustrating a solar cell according to a modified embodiment of the embodiment shown in FIG. 4.

Referring to FIG. 5, the back surface field area in the modified embodiment may have a selective structure for the back surface field area 30. That is, the back surface field area 30 may include a first region 301 which has a high dopant concentration and thus a relatively low resistance, and a second region 302 which has a lower dopant concentration than the first region 301 and thus a relatively high resistance. The first region 301 is formed such that the first region 301 contacts a part or an entirety (that is, at least a part) of the second electrode 34.

Based on this configuration, the second region 302 having a relatively high resistance is formed between the second electrodes 34 upon which light is incident, thereby improving passivation effect. Together with this, the first region 301 having a relatively low resistance in a region adjacent to the first electrode 34 is formed, thereby reducing contact resistance with the first electrode 34. That is, the second portion 30*b* of the back surface field area 30 of the embodiment of the invention maximizes efficiency of the solar cell through the selective structure.

Figure 6:
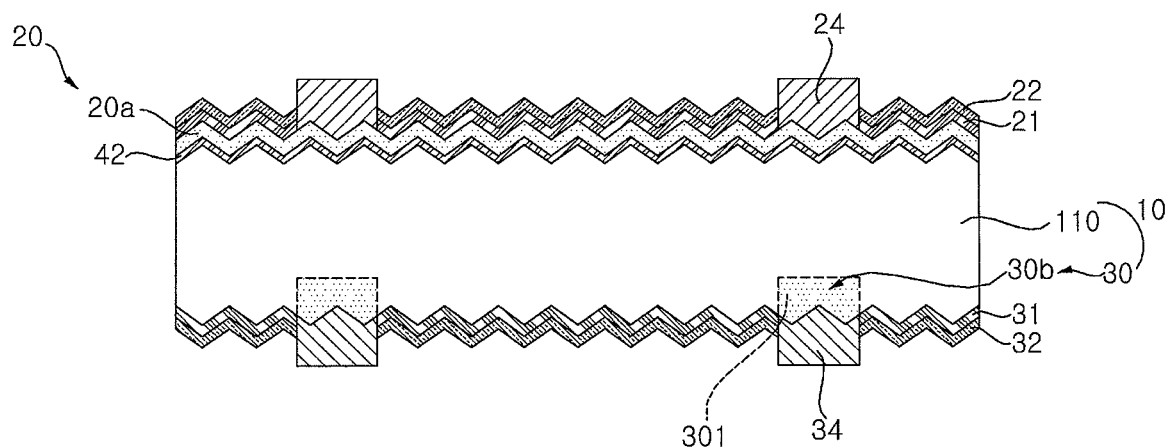
FIG. 6 is a sectional view illustrating another modified embodiment of the embodiment shown in FIG. 4.

FIG. 6 is a sectional view illustrating another modified embodiment of the embodiment shown in FIG. 4.

Referring to FIG. 6, in the embodiment of the invention, the second portion 30*b* of the back surface field area 30 may have a local structure. That is, the second portion 30*b* of the back surface field area 30 may include a first region 301 locally formed only in a region corresponding to at least a part of the second electrode 34. As a result, damage to the semiconductor substrate 10 is minimized and surface recombination sites are thus minimized.

Figure 7:
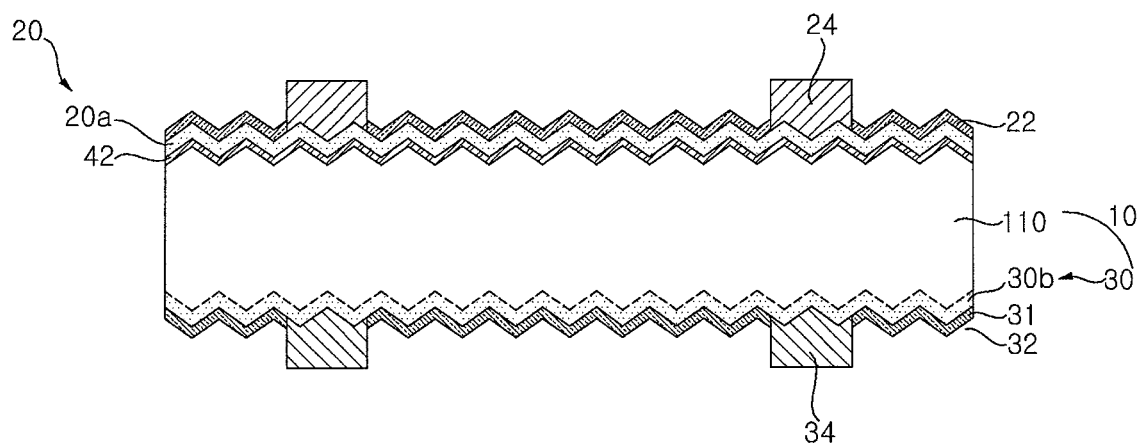
FIG. 7 is a sectional view illustrating a solar cell according to another modified embodiment of the embodiment shown in FIG. 4.

FIG. 7 is a sectional view illustrating a solar cell according to another modified embodiment of the embodiment shown in FIG. 4.

Referring to FIG. 7, the solar cell according to the modified embodiment does not include first and second passivation films 21 and 31 and includes the first anti-reflective film 22 formed on the emitter area 20 and the second anti-reflective film 32 formed on the back surface field area 30. As a result, the overall process is simplified and cost is reduced. In addition, the first and second anti-reflective films 22 and 32 also serve as passivation films. As a result, production efficiency is improved and superior properties of the solar cell are maintained.

The embodiment of the invention allows other various modifications. For example, all configurations in which at least one of the first and second passivation films 21 and 22, and the first and second anti-reflective films 31 and 32 is not provided fall into the scope of the embodiment of the invention.

FIG. 7 illustrates an example in which the second portion 30*b* of the back surface field area 30 has a uniform structure shown in FIG. 4, but the second portion 30*b* of the back surface field area 30 may have a selective structure or a local structure shown in FIG. 5 or 6.

Figure 8:
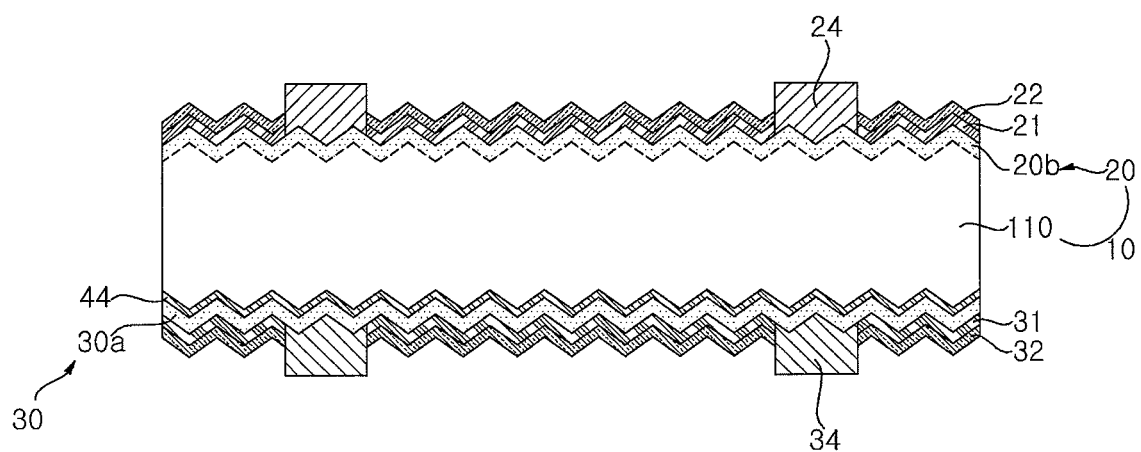
FIG. 8 is a sectional view illustrating a solar cell according to another embodiment of the invention.

FIG. 8 is a sectional view illustrating a solar cell according to another embodiment of the invention.

Referring to FIG. 8, in the solar cell according to the embodiment of the invention, the emitter area 20 includes a second portion 20*b* including a doping area formed in the semiconductor substrate 10. That is, the semiconductor substrate 10 may include the base area 110 as an undoped region and the second portion 20*b* of the emitter area 20 formed by doping the semiconductor substrate 10 with a dopant having a conductive type different from the semiconductor substrate 10. As a result, the second portion 20*b* may have the same crystalline structure as the base area 110. The emitter area 20 may be formed by a variety of doping methods (for example, thermal diffusion, ion implantation or the like).

In the drawing, an instance in which the second portion 20*b* of the emitter area 20 has a homogeneous structure having a uniform doping concentration is exemplified, but the embodiment of the invention is not limited thereto and modified embodiments associated therewith will be described again with reference to FIG. 9.

The first passivation film 21 and/or the first anti-reflective film 22 may be formed on the emitter area 20.

In an instance in which the emitter area 20 including the second portion 20*b* formed by doping the semiconductor substrate 10 is formed, a previous process may be used on the back surface during formation of the emitter area 20. Accordingly, previous equipment may be used. That is, properties can be improved in consideration of efficiency and production efficiency.

Figure 9:
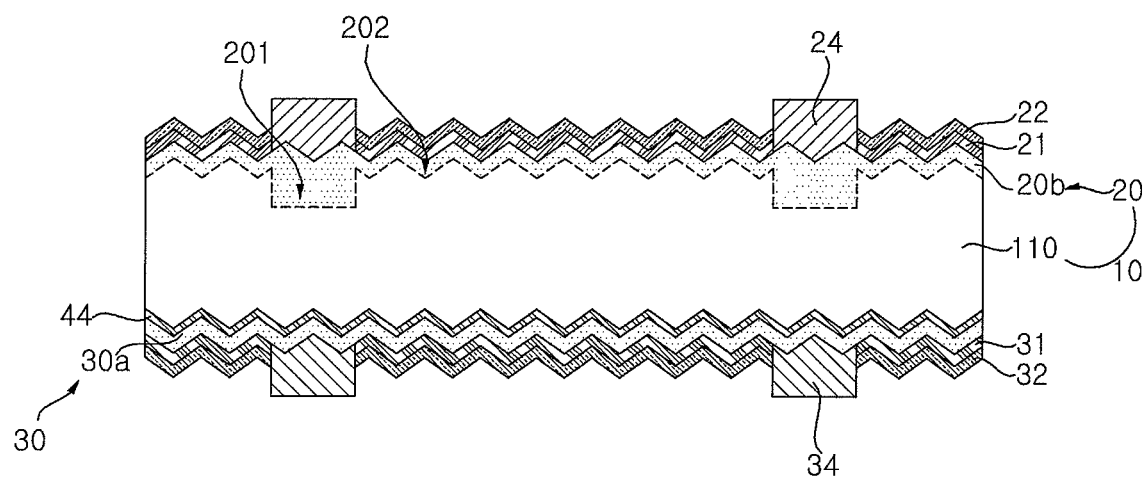
FIG. 9 is a sectional view illustrating a solar cell according to a modified embodiment of the embodiment shown in FIG. 8.

FIG. 9 is a sectional view illustrating a solar cell according to a modified embodiment of the embodiment shown in FIG. 8.

Referring to FIG. 9, in the embodiment of the invention, the second portion 20b of the emitter area 20 may have a selective structure.

That is, the emitter area 20 may include a first region 201 which has a high dopant concentration and thus a relatively low resistance, and a second region 202 which has a lower dopant concentration than the first region 301 and thus a relatively high resistance. The first region 201 is formed such that the first region 201 contacts a part or an entirety (that is, at least a part) of the first electrode 24.

As such, in the embodiment of the invention, the second region 202 having a relatively high resistance is formed in a region between the first electrode 24 into which light is incident, thereby implementing a shallow emitter. As a result, current density of the solar cell is improved. Together with this, the first region 201 having a relatively low resistance is formed in a region adjacent to the first electrode 24, thereby reducing contact resistance with the first electrode 24. That is, the second portion 20b of the emitter area 20 according to the embodiment of the invention maximizes efficiency of the solar cell through the selective emitter structure.

Figure 10:
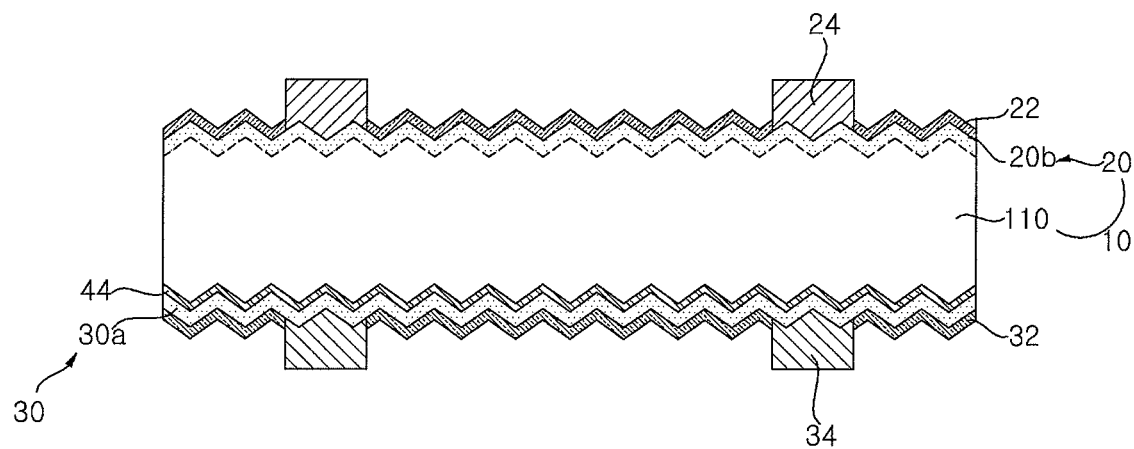
FIG. 10 is a sectional view illustrating a solar cell according to another modified embodiment of the embodiment shown in FIG. 8.

FIG. 10 is a sectional view illustrating a solar cell according to another modified embodiment of the embodiment shown in FIG. 8.

Referring to FIG. 10, the solar cell according to the modified embodiment does not include first and second passivation films 21 and 31, and includes the first anti-reflective film 22 formed on the emitter area 20 and the second anti-reflective film 32 formed on the back surface field area 30. As a result, the overall process is simplified and cost is reduced. In addition, the first and second anti-reflective films 22 and 32 also serve as passivation films. As a result, production efficiency is improved and superior properties of the solar cell are maintained.

The embodiment of the invention allows other various modifications. For example, all configurations in which at least one of the first and second passivation films 21 and 22, and the first and second anti-reflective films 31 and 32 is not provided fall into the scope of the embodiment of the invention.

FIG. 10 illustrates an example in which the second portion 20b of the emitter area 20 has a uniform structure shown in FIG. 8, but the second portion 20b of the emitter area 20 may have a selective structure shown in FIG. 9 in other embodiments of the invention.

Figure 11:
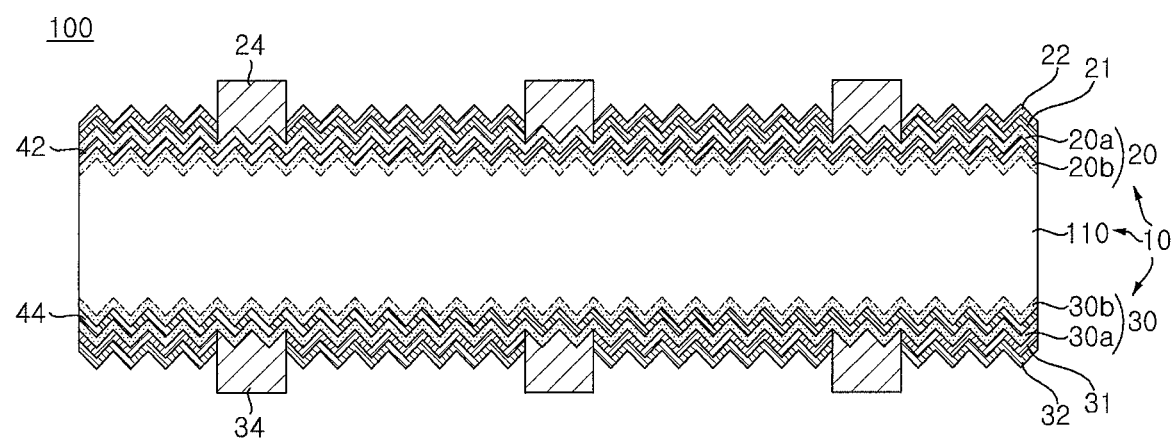
FIG. 11 is a sectional view illustrating a solar cell according to another embodiment of the invention.

FIG. 11 is a sectional view illustrating a solar cell according to another embodiment of the invention. Referring to FIG. 11, in the embodiment of the invention, at least one of the conductive type areas 20 and 30 may include a plurality of portions 20a, 20b, 30a and 30b disposed such that tunneling layers 42 and 44 are interposed between the portions.

In the embodiment of the invention, the emitter area 20 includes a plurality of portions disposed such that the first tunneling layer 42 is interposed between the portions. Specifically, in the embodiment of the invention, the emitter area 20 includes the first portion 20a and the second portion 20b disposed such that the first tunneling layer 42 is interposed between the first and second portions 20a and 20b. In the drawings and the descriptions, an instance in which the portions of the emitter area 20 includes two layers in total (that is, the first portion 20a and the second portion 20b) is exemplified, but the embodiment of the invention is not limited thereto and the portions of the emitter area 20 may include a plurality of portions including three or more layers. The emitter area 20 will be described in more detail.

In this instance, the first portion 20a of the emitter area 20 may be disposed between the first tunneling layer 42 and the first electrode 24 on the first tunneling layer 42. The first portion 20a has been described with reference to the embodiment shown in FIG. 1 and a detailed explanation of contents the same as the description thereof is omitted.

The second portion 20b of the emitter area 20 is formed in an inner portion of the semiconductor substrate adjacent to the front surface of the semiconductor substrate 10, or is formed adjacent to the semiconductor substrate 10 on the front surface of the semiconductor substrate 10. That is, the emitter area 20 may be formed in a portion of the semiconductor substrate 10 adjacent to the first tunneling layer 42 or may be disposed between the semiconductor substrate 10 and the first tunneling layer 42 or between the base area 110 and the first tunneling layer 42.

For example, in the embodiment of the invention, the second portion 20b may be composed of a doping area formed by doping the semiconductor substrate 10 with a second conductive type dopant. Accordingly, the second portion 20b may be composed of a monocrystalline semiconductor (for example, monocrystalline silicon) doped with a second conductive type dopant. In this instance, the second conductive type dopant may be any impurity having a second conductive type opposite to the base area 110. That is, when the second conductive type dopant is p-type, a Group III element such as boron (B), aluminum (Al), gallium (Ga) or indium (In) may be used. When the second conductive type dopant is n-type, a Group V element such as phosphorous (P), arsenic (As), bismuth (Bi) or antimony (Sb) may be used.

The first portion 20a and the second portion 20b may be entirely formed over the front surface of the semiconductor substrate 10. As used herein, the expression "entirely formed" means that the first portion 20a or the second portion 20b is formed over 100% of the front surface, or an area in which the first portion 20a or the second portion 20b is not formed is inevitably disposed in a part of the surface. By entirely forming the first portion 20a and the second portion 20b, an area of pn junction is maximized and an additional patterning process or the like is omitted.

The second portion 20b may include a doping area formed by diffusing the second conductive type dopant in the first portion 20a into the semiconductor substrate 10. In this instance, the second conductive type dopant in the second portion 20b and the second conductive type dopant in the first portion 20a may include an identical material. For example, when the first portion 20a includes boron (B) as the second conductive type dopant, the second portion 20b also includes boron as the second conductive type dopant. This will be described in more detail later, but the embodiment of the invention is not limited thereto and various processes such as separate formation of the first portion 20a and the second portion 20b may be performed.

The second portion 20b is an area which forms a pn junction with the base area 110 in the semiconductor substrate 10. The first portion 20a is an area connected to the first electrode 24 on the first tunneling layer 42.

In this Instance, the second portion 20b and the first portion 20a of the emitter area 20 are doped at different doping concentrations with the second conductive type dopant. Specifically, because the doping concentration of the first portion 20a is higher than the doping concentration of the second portion 20b, the second portion 20b forms a low concentration doping portion and the first portion 20a forms a high concentration doping portion. In this instance, the doping concentration in the first portion 20a may be uniform. Alternatively, a doping concentration of a region adjacent to the first electrode 24 may be higher than a doping concentration of a region adjacent to the first tunneling layer 42. In this instance, by controlling process conditions for forming the first portion 20a, the doping concentration is gradually or stepwise increased, as a distance from the first tunneling layer 42 increases. As such, when the doping concentration of the region adjacent to the first electrode 24 is relatively higher, contact resistance between the emitter area 20 and the first electrode 24 can be minimized.

The second portion 20b disposed in the semiconductor substrate 10 is formed in a low concentration, thereby minimizing recombination of carriers (in particular, Auger recombination) which may be generated or occur in the second portion 20b. In addition, the first portion 20a which is connected to the first electrode 24 while contacting the first electrode 24 is formed in a high concentration, thereby minimizing contact resistance with the first electrode 24.

For example, a ratio of the doping concentration of the first portion 20a to the doping concentration of the second portion 20b may be 5 to 10. When the concentration ratio is lower than 5, the effect of reducing recombination may be insufficient due to a high doping concentration of the second portion 20b. When the concentration ratio exceeds 10, properties of pn junction may be deteriorated due to insufficient formation of the second portion 20b. In this instance, the doping concentration of the second portion 20b may be $5 \times 10^{18}/cm^3$ to $5 \times 10^{19}/cm^3$, and the doping concentration of the first portion 20a may be $5 \times 10^{19}/cm^3$ to $5 \times 10^{20}/cm^3$ which is higher than the doping concentration of the second portion 20b. Within the doping concentration range, the first portion 20a forms a pn junction and recombination is minimized, and the second portion 20b may have superior electrical properties with the first electrode 24, but the embodiment of the invention is not limited thereto and doping concentrations or the like of the first and second portions 20a and 20b may be changed.

In addition, the second portion 20b and the first portion 20a of the emitter area 20 may differ from each other in thickness. More specifically, the first portion 20a is thicker than the second portion 20b, and the first and second portions 20a and 20b may be thicker than the first tunneling layer 42. The thickness of the second portion 20b is controlled to a relatively small level, thereby minimizing recombination of carriers which may be generated or occur in the semiconductor substrate 10. In addition, the first portion 20a is formed at a relatively great thickness, thereby maintaining excellent contact with the first electrode 24. In addition, the thickness of the first tunneling layer 42 is controlled to the minimum, thereby preventing blocking of flow of majority carriers between the second portion 20b and the first portion 20a, but the embodiment of the invention is not limited thereto and the second portion 20b may be thicker than the first portion 20a.

For example, a ratio of the thickness of the first portion 20a to the thickness of the second portion 20b may be 0.5 to 100, more specifically, 1 to 100. When taking into consideration recombination of carriers which may be generated or occur by the second portion 20b, minimization of damage to the semiconductor substrate 10, electrical properties of the first portion 20a and the like, the thickness ratio may be 10 to 50. In this instance, the thickness of the second portion 20b may be 5 nm to 100 nm, and the thickness of the first portion 20a may be 50 nm to 500 nm, but the embodiment of the invention is not limited thereto and thicknesses or the like of the first and second portions 20a and 20b may be changed.

As described above, the low concentration doping portion, the second portion 20b, forms a pn junction with the base area 110. Unlike the embodiment of the invention, the emitter layer is formed only on the first tunneling layer 42, thereby preventing problems generated upon formation of pn junction between the first tunneling layer 42 and the emitter layer. That is, when the emitter layer is formed only on the first tunneling layer 42, physical interface is formed between the first tunneling layer 42 and the emitter layer constituting the pn junction and properties of the emitter layer is greatly affected by properties of the interface. For this reason, there is a difficulty in securing stability of qualities of the emitter layer. On the other hand, in the embodiment of the invention, the second portion 20b of the emitter area 20 forms a pn junction such that the second portion 20b is disposed in the semiconductor substrate 10 or contacts the semiconductor substrate 10, thus securing stability of the pn junction. As a result, open circuit voltage of the solar cell 100 is improved and efficiency of the solar cell 100 is thus improved.

The first tunneling layer 42 disposed between the second portion 20b and the first portion 20a prevents minority carriers from being injected into the first portion 20a from the second portion 20b and thereby inhibits recombination between the carriers in the first portions 20a having a high concentration. In addition, the first electrode 24 is connected to the high concentration doping portion, the first portion 20a, thereby minimizing contact resistance between the emitter area 20 and the first electrode 24. As a result, fill factor of the solar cell 100 is improved and efficiency of the solar cell 100 is thus improved.

In the embodiment of the invention, the back surface field area 30 includes a plurality of portions disposed such that the second tunneling layer 44 is interposed between the portions. Specifically, in the embodiment of the invention, the back surface field area 30 includes the second portion 30b and the first portion 30a which are disposed such that the second tunneling layer 44 is interposed between the portions 30b and 30a. In the drawings and the description, an instance in which the portions of the back surface field area 30 includes two layers in total (that is, the first portion 30a and the second portion 30b) is exemplified, but the embodiment of the invention is not limited thereto and the portions of the back surface field area 30 include a plurality of portions including three or more layers. The back surface field area 30 will be described in more detail.

The second portion 30b of the back surface field area 30 may be formed in an inner portion of the semiconductor substrate 10 adjacent to the back surface of the semiconductor substrate 10, or may be formed adjacent to the semiconductor substrate 10 on the back surface of the semiconductor substrate 10. That is, the back surface field area 30 may be formed in a portion of the semiconductor substrate 10 adjacent to the second tunneling layer 44, or between the semiconductor substrate 10 and the second tunneling layer 44, or between the base area 110 and the second tunneling layer 44.

In this instance, the first portion 30a of the back surface field area 30 may be disposed between the second tunneling layer 44 and the second electrode 34 on the second tunneling layer 44. The first portion 30a has been described with reference to the embodiment shown in FIG. 1 and a detailed explanation of contents the same as the description thereof is omitted.

For example, in the embodiment of the invention, the second portion 30b may be composed of a doping region formed by doping the semiconductor substrate 10 with a first conductive type dopant in a higher concentration than the base area 100. Accordingly, the second portion 30b may be composed of a monocrystalline semiconductor (for example, monocrystalline silicon) doped with a first conductive type dopant. In this instance, the first conductive type dopant may be any impurity having the same first conductive type as the base area 110. That is, when the first conductive type dopant is n-type, a Group V element such as phosphorous (P), arsenic (As), bismuth (Bi) or antimony (Sb) may be used. When the first conductive type dopant is p-type, a Group III element such as boron (B), aluminum (Al), gallium (Ga) or indium (In) may be used.

The second portion 30b and the first portion 30a may be entirely formed over the back surface of the semiconductor substrate 10. As used herein, the expression "entirely formed" means that the first portion 20a or the second portion 20b is formed over 100% of the front surface, or an area in which the first portion 20a or the second portion 20b is not formed is inevitably disposed in a part of the surface. By entirely forming the second portion 30b and the first portion 30a, an area of the back surface field structure is maximized and an additional patterning process or the like is omitted.

The second portion 30b may include a doping area formed by diffusing the first conductive type dopant in the first portion 30a into the semiconductor substrate 10. In this instance, the first conductive type dopant in the second portion 30b and the first conductive type dopant in the first portion 30a may include an identical material. For example, when the first portion 30a includes phosphorous (P) as the first conductive type dopant, the second portion 30b may also include phosphorous (P) as the first conductive type dopant. This will be described in more detail later, but the embodiment of the invention is not limited thereto and various processes such as separate formation of the second portion 30b and the first portion 30a may be performed.

The second portion 30b is an area which forms a back surface field structure with the base area 110 in the semiconductor substrate 10. The first portion 30a is an area connected to the second electrode 34 on the second tunneling layer 44.

In this instance, the second portion 30b and the first portion 30a of the back surface field area 30 are doped at different doping concentrations with the first conductive type dopant. Specifically, because the doping concentration of the first portion 30a is higher than the doping concentration of the second portion 30b, the second portion 30b forms a low concentration doping portion and the first portion 30a forms a high concentration doping portion. In this instance, the doping concentration in the first portion 30a may be uniform. Alternatively, a doping concentration of a region adjacent to the second electrode 34 may be higher than a doping concentration of a region adjacent to the second tunneling layer 44. In this instance, by controlling process conditions for forming the first portion 30a, the doping concentration is gradually or stepwise increased, as a distance from the second tunneling layer 44 increases. As such, when the doping concentration of the region adjacent to the second electrode 34 is relatively higher, contact resistance between the back surface field area 30 and the second electrode 34 can be minimized.

The second portion 30b disposed in the semiconductor substrate 10 is formed in a low concentration, thereby minimizing recombination of carriers which may be generated or occur in the second portion 30b. In addition, the first portion 30a, which is connected to the second electrode 34 while contacting the second electrode 34, is formed in a high concentration, thereby minimizing contact resistance with the second electrode 34.

For example, a ratio of the doping concentration of the second portion 30a to the doping concentration of the second portion 30b may be 5 to 10. When the concentration ratio is lower than 5, the effect of reducing recombination may be insufficient due to a high doping concentration of the second portion 30b. When the concentration ratio exceeds 10, the back surface field effect may be insufficient due to insufficient formation of the second portion 30b. In this instance, the doping concentration of the second portion 30b may be $5 \times 10^{18}/cm^3$ to $5 \times 10^{19}/cm^3$, and the doping concentration of the first portion 30a may be $5 \times 10^{19}/cm^3$ to $5 \times 10^{20}/cm^3$ which is higher than the doping concentration of the second portion 30b. Within the doping concentration range, the second portion 30b forms a back surface field structure with superior properties and the second portion 30a may have superior electrical properties with the second electrode 34, but the embodiment of the invention is not limited thereto and doping concentrations or the like of the first and second portions 30a and 30b may be changed.

In addition, the second portion 30b and the first portion 30a of the back surface field area 30 may differ from each other in thickness. More specifically, the first portion 30a is thicker than the second portion 30b, and the first and second portions 30a and 30b may be thicker than the second tunneling layer 44. The thickness of the second portion 30b is controlled to a relatively small level, thereby minimizing recombination of carriers which may be generated or occur in the semiconductor substrate 10. In addition, the first portion 30a is formed at a relatively great thickness, thereby maintaining excellent contact with the second electrode 44. In addition, the thickness of the second tunneling layer 44 is controlled to the minimum, thereby preventing blocking of flow of majority carriers between the second portion 30b and the first portion 30a, but the embodiment of the invention is not limited thereto and the second portion 30b may be thicker than the first portion 30a.

For example, a ratio of the thickness of the first portion 30a to the thickness of the second portion 30b may be 0.5 to 100, more specifically, 1 to 100. When taking into consideration recombination of carriers which may be generated or occur by the second portion 30b, minimization of damage to the semiconductor substrate 10, electrical properties of the first portion 30a and the like, the thickness ratio may be 10 to 50. In this instance, the thickness of the second portion 30b may be 5 nm to 100 nm, and the thickness of the first portion 30a may be 50 nm to 500 nm, but the embodiment of the invention is not limited thereto and thicknesses or the like of the first and second portions 30a and 30b may be changed.

As described above, the low concentration doping portion, the second portion 30b forms the back surface field structure with the base area 110. Accordingly, the back surface field structure is formed in the semiconductor substrate 10 or is formed while contacting the semiconductor substrate 10, thereby securing stability of the back surface field structure. As a result, open circuit voltage of the solar cell 100 is improved and efficiency of the solar cell 100 is thus enhanced.

The second tunneling layer 44 disposed between the second portion 30b and the first portion 30a prevents minority carriers from being injected into the first portion 30a from the second portion 30b and thereby inhibits recombination between the carriers in the first portions 30a having a high concentration. In addition, the second electrode 34 is connected to the high concentration doping portion, the first portion 30a, thereby minimizing contact resistance between the back surface field area 30 and the second electrode 34. As a result, fill factor of the solar cell 100 is improved and efficiency of the solar cell 100 is thus improved.

In the embodiment of the invention, the conductive type areas 20 and 30 include first portions 20a and 30a, and second portions 20b and 30b disposed such that tunneling layers 42 and 44 are interposed therebetween, thereby minimizing recombination in the semiconductor substrate 10 and improving electrical connection to the first and second electrodes 24 and 34. As a result, efficiency of the solar cell 100 can be improved.

Figure 12:
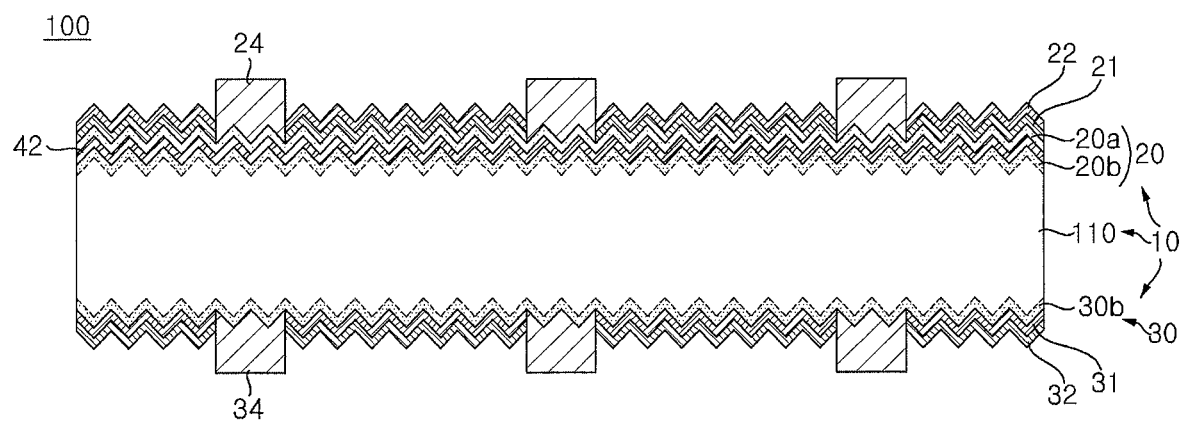
FIG. 12 is a sectional view illustrating a solar cell according to another modified embodiment of the embodiment shown in FIG. 11.
Figure 13:
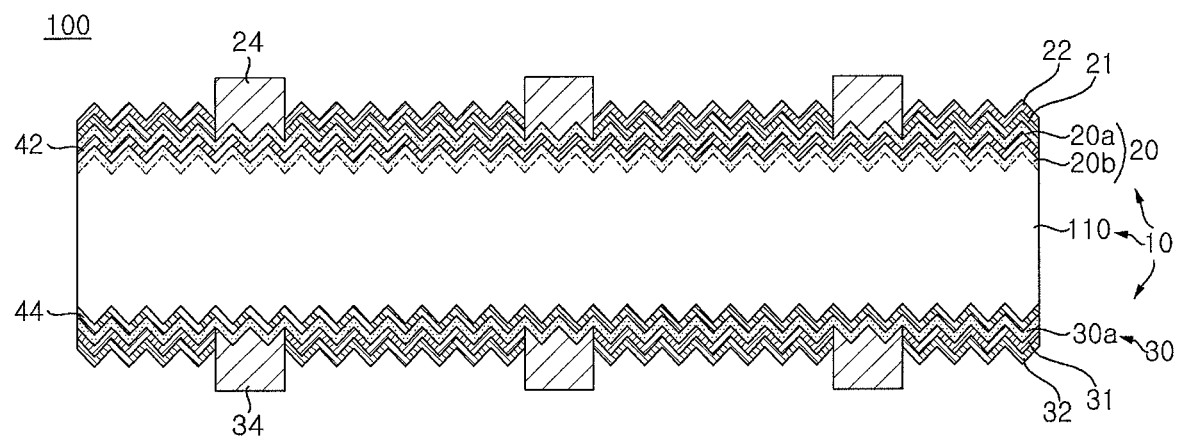
FIG. 13 is a sectional view illustrating a solar cell according to another modified embodiment of the embodiment shown in FIG. 11.
Figure 14:
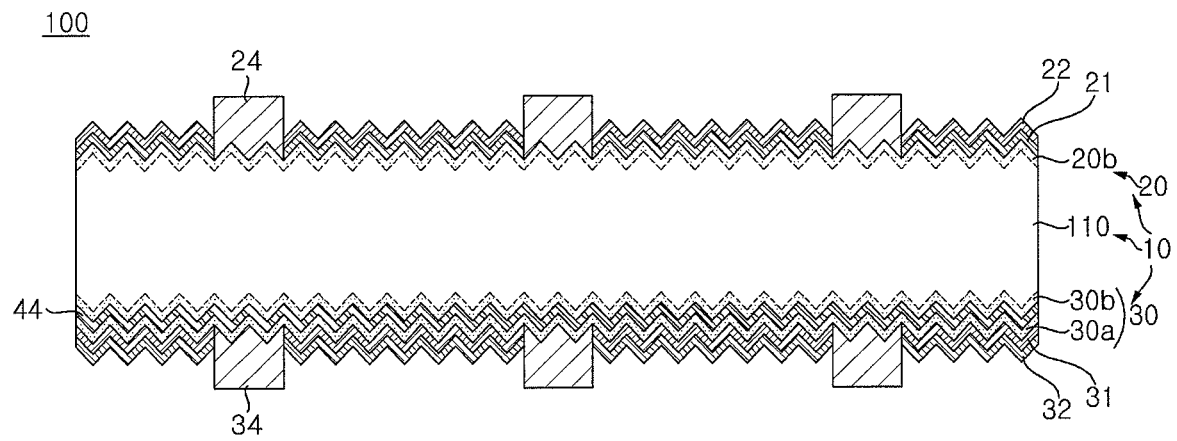
FIG. 14 is a sectional view illustrating a solar cell according to another modified embodiment of the embodiment shown in FIG. 11.
Figure 15:
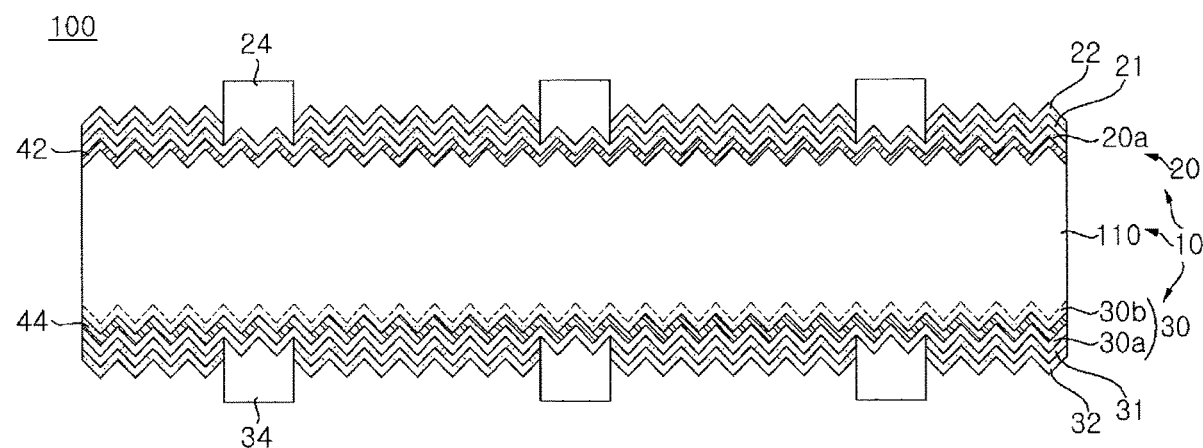
FIG. 15 is a sectional view illustrating a solar cell according to another modified embodiment of the embodiment shown in FIG. 11.

In the drawing of FIG. 11, an instance in which the emitter area 20 includes the first and second portions 20a and 20b, while the back surface field area 30 includes the first and second portions 30a and 30b is exemplified, but the embodiment of the invention is not limited thereto. In a modified embodiment, as shown in FIGS. 12 and 13, the emitter area 20 includes the first and second portions 20a and 20b and the back surface field area 30 includes a single portion. In this instance, as shown in FIG. 12, the back surface field area 30 may include a second portion 30b including a doping area disposed in the semiconductor substrate 10. Alternatively, as shown in FIG. 13, the back surface field area 30 may include an additional first portion 30a formed on the second tunneling layer 44 on the back surface of the semiconductor substrate 10. In another modified embodiment, as shown in FIGS. 14 and 15, the back surface field area 30 includes first and second portions 30a and 30b and the emitter area 20 includes a single portion. In this instance, as shown in FIG. 14, the emitter area 20 may include a second portion 20b including a doping area disposed in the semiconductor substrate 10. Alternatively, as shown in FIG. 15, the emitter area 20 may include an additional first portion 20a on the second tunneling layer 44 formed on the back surface of the semiconductor substrate 10. In addition, the second portions 20b and 30b of the emitter area 20 or the back surface field area 30 may have a variety of structures such as a selective structure including portions having different doping concentrations or a local structure locally formed in areas adjacent to the electrodes 42 and 44. The selective structure or local structure or the like has been described with reference to FIGS. 5, 6 and 9 and a detailed explanation thereof is omitted.

Hereinafter, the manufacturing method of the solar cell 100 according to the embodiment shown in FIG. 11 will be described in detail with reference to FIGS. 16A to 16E. Hereinafter, details of the description given above are not mentioned and only difference from the description above is described in detail. In addition, the manufacturing method described below may be applied to the corresponding part of the embodiment shown in FIG. 1.

FIGS. 16A to 16E are sectional views for illustrating a method for manufacturing a solar cell according to an embodiment of the invention.

Figure 16A:
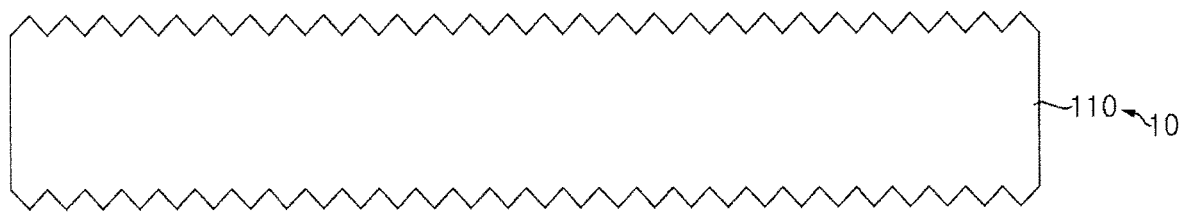
FIG. 16A to 16E are sectional views for illustrating the manufacturing method of the solar cell shown in FIG. 11.

First, as shown in FIG. 16A, a semiconductor substrate 10 including a base area 110 having a first conductive type dopant is prepared. In the embodiment of the invention, the semiconductor substrate 10 may include silicon having an n-type impurity. Examples of the n-type impurity include, but are not limited to, Group V elements such as phosphorous (P), arsenic (As), bismuth (Bi) and antimony (Sb).

At least one of the front and back surfaces of the semiconductor substrate 10 is textured so that the surface has irregularities. Wet or dry texturing may be used as the texturing of the surface of the semiconductor substrate 10. Wet texturing may be carried out by dipping the semiconductor substrate 10 in a texturing solution and has an advantage of a short process time. Dry texturing is a process of cutting the surface of the semiconductor substrate 10 using a diamond drill, laser or the like and enables formation of uniform irregularities, but disadvantageously has long process time and causes damage to the semiconductor substrate 10. Alternatively, the semiconductor substrate 10 may be textured by reactive ion etching (RIE) or the like. As such, the semiconductor substrate 10 may be textured by a variety of methods.

Figure 16B:
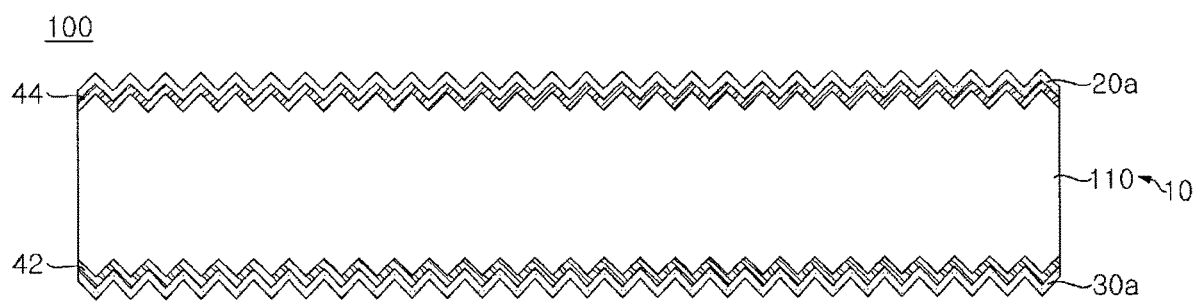

Then, as shown in FIG. 16B, a first tunneling layer 42 and a first portion 20a of an emitter area 20 are formed on the front surface of the semiconductor substrate 10 and a second tunneling layer 44 and a first portion 30a of a back surface field area 30 are formed on the back surface of the semiconductor substrate 10.

In this instance, the first and second tunneling layers 42 and 44 may be formed, for example, by a method such as thermal growth or deposition (for example, plasma-enhanced chemical vapor deposition chemical (PECVD), atomic layer deposition (ALD)) or the like, but the embodiment of the invention is not limited thereto and the first and second tunneling layers 42 and 44 may be formed by a variety of methods. In addition, first portions 20a and 30a of conductive type areas 20 and 30 may be formed of an amorphous, microcrystalline, or polycrystalline semiconductor. In this instance, the first portions 20a and 30a may be formed by a method, for example, thermal growth, deposition (for example, plasma-enhanced chemical vapor deposition chemical (PECVD)) or the like.

In addition, the first or second conductive type dopant may be incorporated when forming the semiconductor layer constituting the first portions 20a and 30a, and may be doped after forming the semiconductor layer constituting the first portions 20a and 30a, but the embodiment of the invention is not limited thereto and the first portions 20a and 30a may be formed by a variety of methods.

A formation order or the like of the first tunneling layer 42, the second tunneling layer 44, and the first portions 20a and 30a may be varied.

Figure 16C:
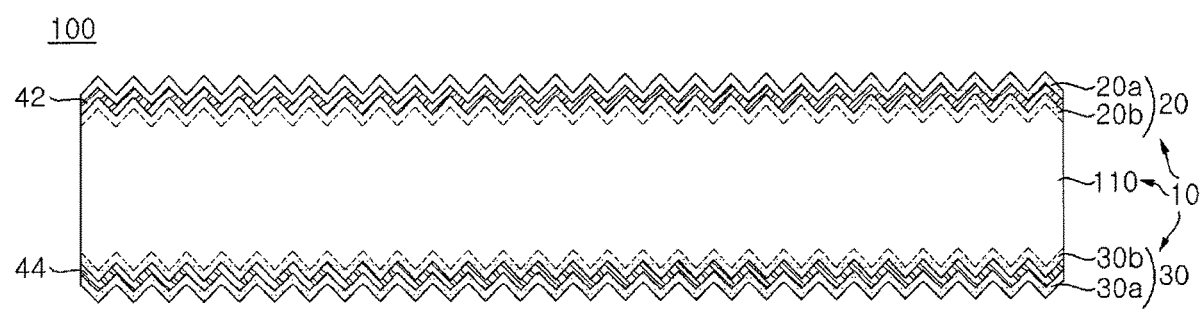

Then, as shown in FIG. 16C, the second conductive type dopant in the first portion 20a is diffused into the semiconductor substrate 10 by thermal treatment to form the second portion 20b of the emitter area 20, and the first conductive type dopant in the first portion 30a is diffused into the semiconductor substrate 10 to form the second portion 30b of the back surface field area 30. As such, in the embodiment of the invention, the first portions 20a and 30a serve as doping sources, thereby forming the second portions 20b and 30b through diffusion using thermal treatment without using an additional doping method such as ion implantation. As a result, the manufacturing process can be simplified.

Figure 16D:
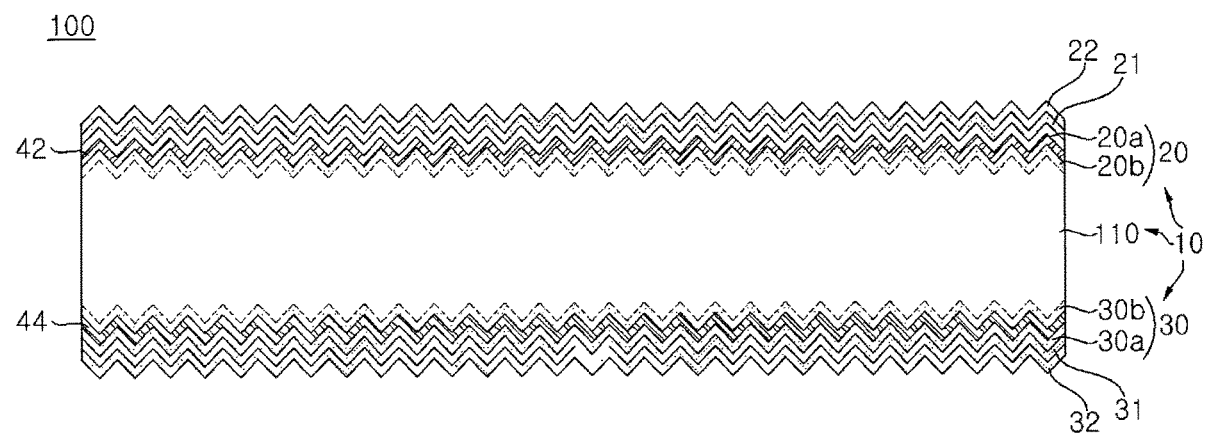

Then, as shown in FIG. 16D, a first passivation film 21 and a first anti-reflective film 22 are formed on the first portion 20a of the emitter area 20 and a second passivation film 31 and a second anti-reflective film 32 are formed on the first portion 30a of the back surface field area 30. The passivation films 21 and 31 and the anti-reflective films 22 and 32 may be formed by a variety of methods such as vacuum deposition, chemical vapor deposition, spin coating, screen printing or spray coating. A formation order or the like of the passivation films 21 and 31 and the anti-reflective films 22 and 32 may be varied.

Figure 16E:
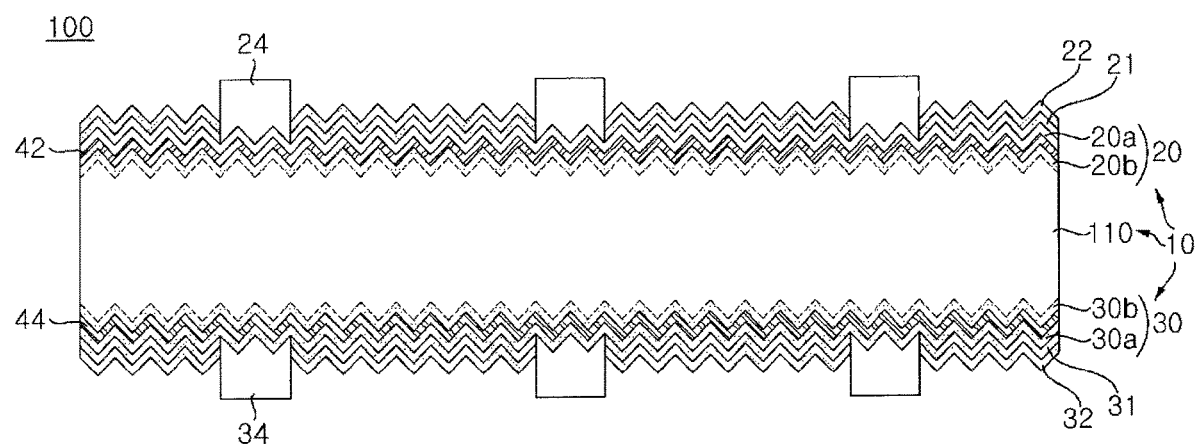

Then, as shown in FIG. 16E, first and second electrodes 24 and 34 respectively connected to the conductive type areas 20 and 30 are formed. In this instance, for example, openings are formed in the passivation films 21 and 31 and the anti-reflective films 22 and 32, and the first and second electrodes 24 and 34 are formed in the openings by a variety of methods such as coating or deposition.

In another embodiment, the first and second electrodes 24 and 34 may be formed by applying a paste for forming the first and second electrodes onto the passivation films 21 and 31 and the anti-reflective films 22 and 32 by screen printing or the like, and then performing fire through, laser firing contact or the like thereon. In this instance, because the openings are formed during formation of the first and second electrodes 24 and 34, a process of separately forming the openings is not required.

According to the embodiment of the invention, the second portions 20b and 30b can be formed without using an additional doping method such as ion implantation through diffusion of first or second conductive type dopant in the first portions 20a and 30a. As a result, the solar cell 100 with superior efficiency can be manufacturing by a simple manufacturing process.

In the embodiment described above, an instance in which the first and second tunneling layers 42 and 44, and the conductive type areas 20 and 30 are formed, the passivation films 21 and 31 and the anti-reflective films 22 and 32 are formed, and the first and second electrodes 24 and 34 are then formed is exemplified, but the embodiment of the invention is not limited thereto. Accordingly, a formation order of the first and second tunneling layers 42 and 44, the conductive type areas 20 and 30, the passivation films 21 and 31, the anti-reflective films 22 and 32, and the first and second electrodes 24 and 34 may be varied.

In addition, in the embodiment described above, an instance in which the second portion 20b is formed by diffusing the second conductive type dopant in the first portion 20a of the emitter area 20 and the second portion 30b is formed by diffusing the second conductive type dopant in the first portion 30a of the back surface field area 30 is exemplified, but the embodiment of the invention is not limited thereto and the second portions 20b and 30b may be formed by an additional process (ion implantation, thermal diffusion, laser doping or the like).

Figure 17:
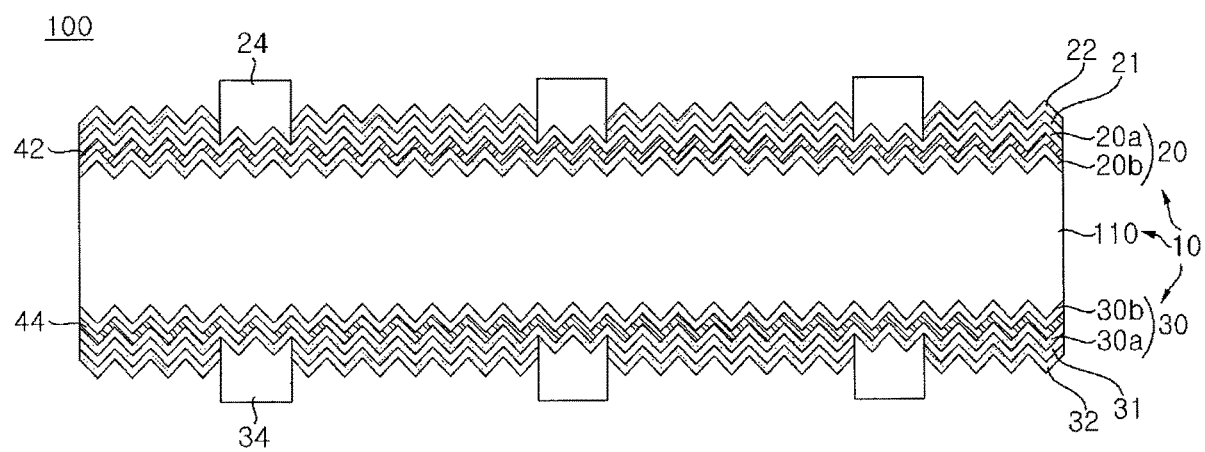
FIG. 17 is a sectional view illustrating a solar cell according to another embodiment of the invention.

FIG. 17 is a sectional view illustrating a solar cell according to another embodiment of the invention.

Referring to FIG. 17, in the embodiment of the invention, the emitter area 20 includes a first portion 20a and a second portion 20b disposed such that the first tunneling layer 42 is interposed between the portions 20a and 20b, and the back surface field area 30 includes a first portion 30a and a second portion 30b disposed such that the second tunneling layer 44 is interposed between the portions 20a and 20b.

In the embodiment of the invention, the second portions 20b and 30b of the conductive type areas 20 and 30 may be formed by doping an amorphous, microcrystalline or polycrystalline semiconductor layer (for example, silicon layer) or the like formed on the semiconductor substrate 10 with a conductive type dopant. That is, the second portions 20b and 30b of the conductive type areas 20 and 30 may be interposed between the semiconductor substrate 10 and the tunneling layers 42 and 44. In this instance, the conductive type dopant may be incorporated during formation of the semiconductor layer constituting the second portions 20b and 30b, and may be doped after formation of the semiconductor layer constituting the second portions 20b and 30b.

As such, in an instance in which the first and second portions 20a and 30a are formed on the semiconductor substrate 10, the semiconductor substrate 10 may include only the base area 110. As a result, problems such as damage to the semiconductor substrate 10 or increased recombination of carriers which may be generated or occur during formation of the doping area on the semiconductor substrate 10 can be fundamentally prevented, but the embodiment of the invention is not limited thereto. Only the second portions 20b and 30b of one of the emitter area 20 and the back surface field area 30 may be formed on the semiconductor substrate 10. Alternatively, any one of the emitter area 20 and the back surface field area 30 may include the first portions 20a and 30a and the second portions 20b and 30b.

Although the example embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A solar cell comprising:
  a monocrystalline silicon substrate;
  an emitter area formed inside of a front surface of the monocrystalline silicon substrate;
  a tunneling oxide layer formed directly on the monocrystalline silicon substrate;
  a polycrystalline silicon back surface field area formed directly on the tunneling oxide layer;
  a front passivation film on the emitter area;
  a back passivation film formed of an insulating material and formed on the polycrystalline silicon back surface field area;
  a front electrode directly connected to the emitter area by penetrating through the front passivation film; and
  a back electrode directly connected to the polycrystalline silicon back surface field area through an opening of the back passivation film,
  wherein a thickness of the polycrystalline silicon back surface field area is about 50 nm to 500 nm;
  wherein the thickness of the polycrystalline silicon back surface field area being about 50 nm to 500 nm is provided when a crystalline structure of the polycrystalline silicon back surface field area being different from that of the monocrystalline silicon substrate and that of the emitter area.

2. The solar cell according to claim 1, wherein the emitter area has a first conductive type dopant, and the monocrystalline silicon substrate has a second conductive type dopant opposite to a conductive type of the first conductive type dopant.

3. The solar cell according to claim 1, wherein the polycrystalline silicon back surface field area has a p-type conductivity, and
  wherein the back passivation film includes at least one of aluminum oxide, zirconium oxide, and hafnium oxide having a negative charge.

4. The solar cell according to claim 1, wherein the polycrystalline silicon back surface field area has an n-type conductivity, and wherein the back passivation film includes at least one of silicon oxide and silicon nitride having a positive charge.

5. The solar cell according to claim 1, further comprising: an additional film on the back passivation film.

6. The solar cell according to claim 5, wherein the additional film includes at least one selected from the group consisting of silicon nitride, silicon nitride containing hydrogen, silicon oxide, silicon oxide nitride, aluminum oxide, $MgF_2$, ZnS, $TiO_2$ and $CeO_2$.

7. The solar cell according to claim 1, wherein a thickness of the tunneling oxide layer is about 0.5 nm to 5 nm.

8. The solar cell according to claim 1, further comprising: an additional back surface field area at a portion of the monocrystalline silicon substrate facing the tunneling oxide layer.

9. The solar cell according to claim 8, wherein the additional back surface field area has a dopant having a conductive type the same as a conductive type of a dopant of the polycrystalline silicon back surface field area.

10. The solar cell according to claim 8, wherein the additional back surface field area has the same crystalline structure as the monocrystalline silicon substrate.

11. The solar cell according to claim 1, wherein the back electrode comprises a plurality of finger electrodes being disposed in parallel to each other.

12. The solar cell according to claim 1, wherein the emitter area includes a first region that is directly contacted with the front electrode and a second region having a dopant concentration lower than a dopant concentration of the first region.

13. The solar cell according to claim 1, wherein the back electrode is not directly formed on the back passivation film.

14. The solar cell according to claim 8, wherein the emitter area and the additional back surface field area have about the same thickness of 5 nm to 100 nm.

15. The solar cell according to claim 10, wherein the tunneling oxide layer is between the additional back surface field area and the polycrystalline silicon back surface field area.

16. The solar cell according to claim 1, wherein the tunneling oxide layer and the back passivation film are separated by a distance of about 50 nm to 500 nm entirely based on a thickness of the polycrystalline silicon back surface field area.

17. The solar cell according to claim 16, wherein the thickness of the polycrystalline silicon back surface field area is the same through the entire polycrystalline silicon back surface field area.

18. The solar cell according to claim 11, wherein the back electrode further comprises a plurality of bus bar electrodes crossing the plurality of finger electrodes.

19. The solar cell according to claim 1, wherein the thickness of the polycrystalline silicon back surface field area is 10 to 1,000 times a thickness of the tunneling oxide layer.

* * * * *